United States Patent
Cai et al.

(10) Patent No.: US 12,265,151 B2
(45) Date of Patent: Apr. 1, 2025

(54) ACCURATE AND EFFICIENT ELECTROMAGNETIC RESPONSE FOR A SENSOR SIMULATOR

(71) Applicant: Aptiv Technologies AG, Schaffhausen (CH)

(72) Inventors: Xiuzhang Cai, Carmel, IN (US); Bruno F. Camps Raga, Olathe, KS (US); Alexander Ioffe, Bonn (DE); Mohannad Saifo, Wuppertal (DE)

(73) Assignee: APTIV TECHNOLOGIES AG, Schaffhausen (CH)

( * ) Notice: Subject to any disclaimer, the term of this patent is extended or adjusted under 35 U.S.C. 154(b) by 500 days.

(21) Appl. No.: 17/654,031

(22) Filed: Mar. 8, 2022

(65) Prior Publication Data

US 2023/0102079 A1 Mar. 30, 2023

Related U.S. Application Data

(60) Provisional application No. 63/250,562, filed on Sep. 30, 2021.

(51) Int. Cl.
    *G01S 13/931* (2020.01)
    *G01S 7/40* (2006.01)
    *G09B 9/54* (2006.01)

(52) U.S. Cl.
    CPC .......... *G01S 13/931* (2013.01); *G01S 7/4052* (2013.01); *G09B 9/54* (2013.01)

(58) Field of Classification Search
    CPC ........ G01S 13/931; G01S 7/4052; G09B 9/54
    (Continued)

(56) References Cited

U.S. PATENT DOCUMENTS

| | | | | |
|---|---|---|---|---|
| 6,498,583 B1 * | 12/2002 | Tsai | .................... | G09B 9/54 |
| | | | | 342/169 |
| 7,567,205 B1 * | 7/2009 | Lee | .................... | G06T 15/06 |
| | | | | 345/426 |

(Continued)

FOREIGN PATENT DOCUMENTS

| | | | | |
|---|---|---|---|---|
| CN | 101923166 A | * | 12/2010 | ............. G01S 13/90 |
| CN | 109100718 B | * | 5/2019 | ............. G01S 13/90 |

(Continued)

OTHER PUBLICATIONS

Chipengo, et al., "High Fidelity Physics Simulation of 128 Channel MIMO Sensor for 77GHz Automotive Radar", Sep. 2, 2020, pp. 160643-160652.

(Continued)

*Primary Examiner* — Nuzhat Pervin
(74) *Attorney, Agent, or Firm* — Harness, Dickey & Pierce, P.L.C.

(57) ABSTRACT

This document describes techniques and systems for accurate and efficient electromagnetic response for a sensor simulator. Target information and sensor parameters for an electromagnetic sensor are simulated in an environment that includes a ground plane. Electromagnetic rays that may be detected by the sensor or an image of the sensor are launched from the simulated sensor toward the target and an image of the target about the ground plane to determine a complex electromagnetic response of the target. A ray-tracing algorithm is applied to trace the forward wave propagation of electromagnetic rays in the environment that considers rays bouncing between the target and the image of the target. An electromagnetic response can be modeled based on the congregation of the electromagnetic response of all backward paths of all bounces of all rays. In this manner, an (Continued)

efficient and accurate electromagnetic response model may be approximated.

17 Claims, 21 Drawing Sheets

(58) Field of Classification Search
USPC .......................................................... 342/174
See application file for complete search history.

(56) References Cited

U.S. PATENT DOCUMENTS

| | | | | |
|---|---|---|---|---|
| 7,750,842 | B2* | 7/2010 | Lee | G01S 7/4052 |
| | | | | 342/426 |
| 7,880,671 | B2* | 2/2011 | Lee | G01S 7/412 |
| | | | | 342/159 |
| 9,575,170 | B2* | 2/2017 | Kurono | G01S 13/42 |
| 10,473,752 | B2* | 11/2019 | Xie | H04R 1/04 |
| 10,592,805 | B2* | 3/2020 | Groh | G06N 3/08 |
| 11,035,931 | B1* | 6/2021 | Kipp | G01S 13/935 |
| 11,246,010 | B2* | 2/2022 | Mao | G01S 5/14 |
| 11,789,113 | B2* | 10/2023 | Sick | G06T 7/11 |
| | | | | 342/107 |
| 11,789,119 | B2* | 10/2023 | Li | G01S 7/4095 |
| | | | | 342/70 |
| 2010/0066595 | A1* | 3/2010 | Lee | G01S 7/412 |
| | | | | 342/179 |
| 2013/0332115 | A1* | 12/2013 | Pratt | G01N 22/04 |
| | | | | 702/189 |
| 2015/0054826 | A1* | 2/2015 | Varga | G09B 9/003 |
| | | | | 345/421 |
| 2017/0364776 | A1* | 12/2017 | Micks | G01S 17/006 |
| 2018/0349526 | A1* | 12/2018 | Atsmon | G06N 3/08 |
| 2020/0025911 | A1 | 1/2020 | Rappaport | |
| 2020/0111382 | A1 | 4/2020 | Sarabandi et al. | |
| 2020/0250363 | A1* | 8/2020 | Partridge | G06F 30/27 |
| 2021/0224436 | A1* | 7/2021 | Camps Raga | G06F 30/20 |
| 2021/0350044 | A1* | 11/2021 | Rey | G06F 30/20 |
| 2021/0356561 | A1* | 11/2021 | Li | G01S 7/4095 |
| 2022/0076061 | A1* | 3/2022 | Fiterman | G06V 10/82 |
| 2023/0099845 | A1 | 3/2023 | Cai et al. | |
| 2023/0102079 | A1 | 3/2023 | Cai et al. | |
| 2023/0117339 | A1 | 4/2023 | Cai et al. | |
| 2023/0343018 | A1* | 10/2023 | Shi | G06T 15/005 |
| 2024/0066804 | A1* | 2/2024 | Orth | G06T 11/008 |
| 2024/0225441 | A1* | 7/2024 | Boutinon | A61B 3/14 |

FOREIGN PATENT DOCUMENTS

| | | | | |
|---|---|---|---|---|
| CN | 118152928 A | * | 6/2024 | ......... G06F 18/2415 |
| EP | 2527871 A1 | * | 11/2012 | ........... G01S 13/885 |
| WO | WO-2015079152 A1 | * | 6/2015 | ......... G06F 17/5009 |
| WO | 2020200454 A1 | | 10/2020 | |

OTHER PUBLICATIONS

Dallman, et al., "Atrium: A Radar Target Simulator for Complex Traffic Scenarios", Apr. 2018, 4 pages.
Gowdu, et al., "Monostatic RCS measurements of a passenger car mock-up at 77 GHz frequency in virtual environment", Oct. 2019, 4 pages.
Gowdu, et al., "Monostatic RCS Measurements of Representative Road Traffic Objects in the 76 . . . 81 GHZ Frequency Band", 6 pages.
Ling, et al., "Shooting and Bouncing Rays: Calculating the RCS of an Arbitrarily Shaped Cavity", Feb. 1989, pp. 194-205.
Yang, et al., "Novel Extension of SBR-PO Method for Solving Electrically Large and Complex Electromagnetic Scattering Problem in Half-Space", Jul. 2017, pp. 3931-3940.
"Extended European Search Report," EP Application No. 23156136, Jun. 15, 2023, 13 pages.
Markus Buhren et al., "Extension of Automotive Radar Target List Simulation to consider further physical aspects", Telecommunications, 2007 ITST, 7th International Conference on Its, IEEE, Piscataway, NJ, USA, Jun. 1, 2007, 7 pages.
"Extended European Search Report", EP Application No. 22195641.0, Jan. 31, 2023, 10 pages.
Buddendick, et al., "Bistatic Scattering Center Models for the Simulation of Wave Propagation in Automotive Radar Systems", German Microwave Conference 2010, Apr. 2010, pp. 288-291.
Cai, "Autonomous Vehicles: MMW Radar Backscattering Modeling of Traffic Environment, Vehicular Communication Modeling, and Antenna Designs", Oct. 4, 2020, 318 pages.
Deep, et al., "Radar Cross-Sections of Pedestrians at Automotive Radar Frequencies Using Ray Tracing and Point Scatterer Modelling", vol. 14, Issue 6, Jun. 2020, pp. 833-844.
Kefeng, et al., "Simulation of SAR Images of Ground Vehicles", Proc. SPIE 7495, MIPPR 2009: Automatic Target Recognition and Image Analysis, Oct. 30, 2009, 7 pages.
Saifo, et al., "Using RCS Radial Pattern Combined with Multi-Path Effect for Automotive Radar Simulations", 2022 52nd European Microwave Conference (EuMC), pp. 286-289.
Hannasch, David A; Spherical Ray-Tracing; Thesis Graduate College of the University of Illinois at Urbana-Champaign; 2016 Urbana, Illinois (Year: 2016).
Jeter III, James W.; A Three-Dimensional Ray Tracing Simulation of a Synthetic Aperture Ground Penetrating Radar System; Thesis; Rochester Institute of Technology; Rochester, New York; Aug. 2002 (Year: 2002).
Kipp, Robert A; Capoglu, liker; Extending Shooting-and-Bouncing Rays Method with Uniform Theory of Diffraction for Installed Antennas; IEEE Antennas and Propagation Society 2014; pp. 2198-2199; (Year: 2014).
Schussler, Christian; A Realistic Radar Ray Tracing Simulator for Large MI MO-Arrays in Automotive Environments; IEEE Journal of Microwaves; vol. 01, No. 04, pp. 1-13; Published Sept 9, 2021; https://ieeexplore.ieee.org/document/9533181 (Year: 2021).
U.S. Appl. No. 17/654,037, filed Mar. 8, 2022, Xiuzhang Cai.
U.S. Appl. No. 17/654,039, filed Mar. 8, 2022.

* cited by examiner

ACCURATE AND EFFICIENT ELECTROMAGNETIC RESPONSE FOR A SENSOR SIMULATOR

CROSS-REFERENCE TO RELATED APPLICATION

This application claims the benefit of U.S. Provisional Patent Application No. 63/250,562, filed Sep. 30, 2021, the disclosure of which is hereby incorporated by reference in its entirety herein.

BACKGROUND

Radars are useful devices that can detect and track objects. Accordingly, radar provides many advantages for autonomous-driving applications or driver-assistance applications. During engineering and development, a radar simulation may be run to evaluate performance of the radar in various conditions. These simulations may benefit from incorporating an electromagnetic response model that simulates an electromagnetic response associated with the radar in a simulated environment. However, existing electromagnetic response models may be too complex or too slow to be used in some computer simulation environments; if used at all, some may fail to accurately simulate real world electromagnetic responses.

SUMMARY

This document describes techniques and systems for accurate and efficient electromagnetic response for a sensor simulator. Target information and sensor parameters for an electromagnetic sensor are simulated in an environment that includes a ground plane. Electromagnetic rays that may be detected by the sensor or an image of the sensor are launched from the simulated sensor toward the target and an image of the target about the ground plane to determine the complex electromagnetic response of the target. The ground plane is removed, and a ray-tracing algorithm is applied to trace the forward wave propagation of electromagnetic rays in the environment that considers rays bouncing between the target and the image of the target. Furthermore, the electromagnetic response is evaluated for up to five different backward paths for each bounce of each ray on the target or the image of the target. The electromagnetic response of each backward path is modeled with the simplified large-element physical optics method. The electromagnetic response includes the polarimetric electromagnetic fields received by the radar sensor with given transmitted power, the total propagation length/time and direction of departure/arrival of the electromagnetic ray. The overall electromagnetic response is modeled based on the congregation of the electromagnetic response of all backward paths of all bounces of all rays. In this manner, an efficient and accurate electromagnetic response model may be approximated.

Aspects described below include accurate and efficient electromagnetic response for a sensor simulator. In one example, a method includes receiving target information for a target and sensor parameters for an electromagnetic sensor that are simulated in an environment with a ground plane. The method further includes determining, based on the target information and the sensor parameters, electromagnetic rays interacting with the target, the electromagnetic rays having forward propagation paths to the target and backward propagation paths from the target. The method further modeling an electromagnetic response by approximating, based on determining the electromagnetic rays interacting with the target, electromagnetic energy reflected by the target alone or in combination with the ground plane.

In another example, a system is described that includes at least one processor configured to perform the above-summarized method and other methods set forth herein. This document also describes non-transitory computer-readable storage media having instructions that, when executed, cause a processor to perform the above-summarized method and other methods set forth herein.

This Summary introduces simplified concepts related to accurate and efficient electromagnetic response for a sensor simulator, further described in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of accurate and efficient electromagnetic response for a sensor simulator are described in this document with reference to the following figures:

FIG. 2-1 illustrates an example electromagnetic simulator that generates accurate and efficient electromagnetic response for a sensor simulator, in accordance with techniques of this disclosure;

FIG. 2-2 illustrates an example sequence flow diagram of the electromagnetic simulator outputting accurate and efficient electromagnetic response for a sensor simulator to the radar simulator, in accordance with techniques of this disclosure;

FIGS. 2-3 and 2-4 illustrate propagation paths and ray densities that are considered by the electromagnetic simulator using techniques for accurate and efficient electromagnetic response for a sensor simulator, in accordance with techniques of this disclosure;

FIG. 3 illustrates a simulation process generating accurate and efficient electromagnetic response for a sensor simulator, in accordance with techniques of this disclosure;

FIGS. 4-1 and 4-2 illustrate an example implementation using a modified shooting and bouncing rays method for accurate and efficient electromagnetic response for a sensor simulator, in accordance with techniques of this disclosure;

FIGS. 5-1 through 5-4 illustrate an adaptive ray-launch process for accurate and efficient electromagnetic response for a sensor simulator, in accordance with techniques of this disclosure;

FIG. 6-1 illustrates a flowchart of a modified ray-tracing process for accurate and efficient electromagnetic response for a sensor simulator, in accordance with techniques of this disclosure;

FIG. 6-2 illustrates an example of a pre-calculated acceleration data structure for a target in an electromagnetic simulator that generates accurate and efficient electromagnetic response for a sensor simulator, in accordance with techniques of this disclosure;

FIGS. 8-1 through 8-3 illustrate example results of an electromagnetic simulator generating accurate and efficient electromagnetic response for a sensor simulator compared to other commercial simulators, in accordance with techniques of this disclosure;

DETAILED DESCRIPTION

Overview

Figure 1:
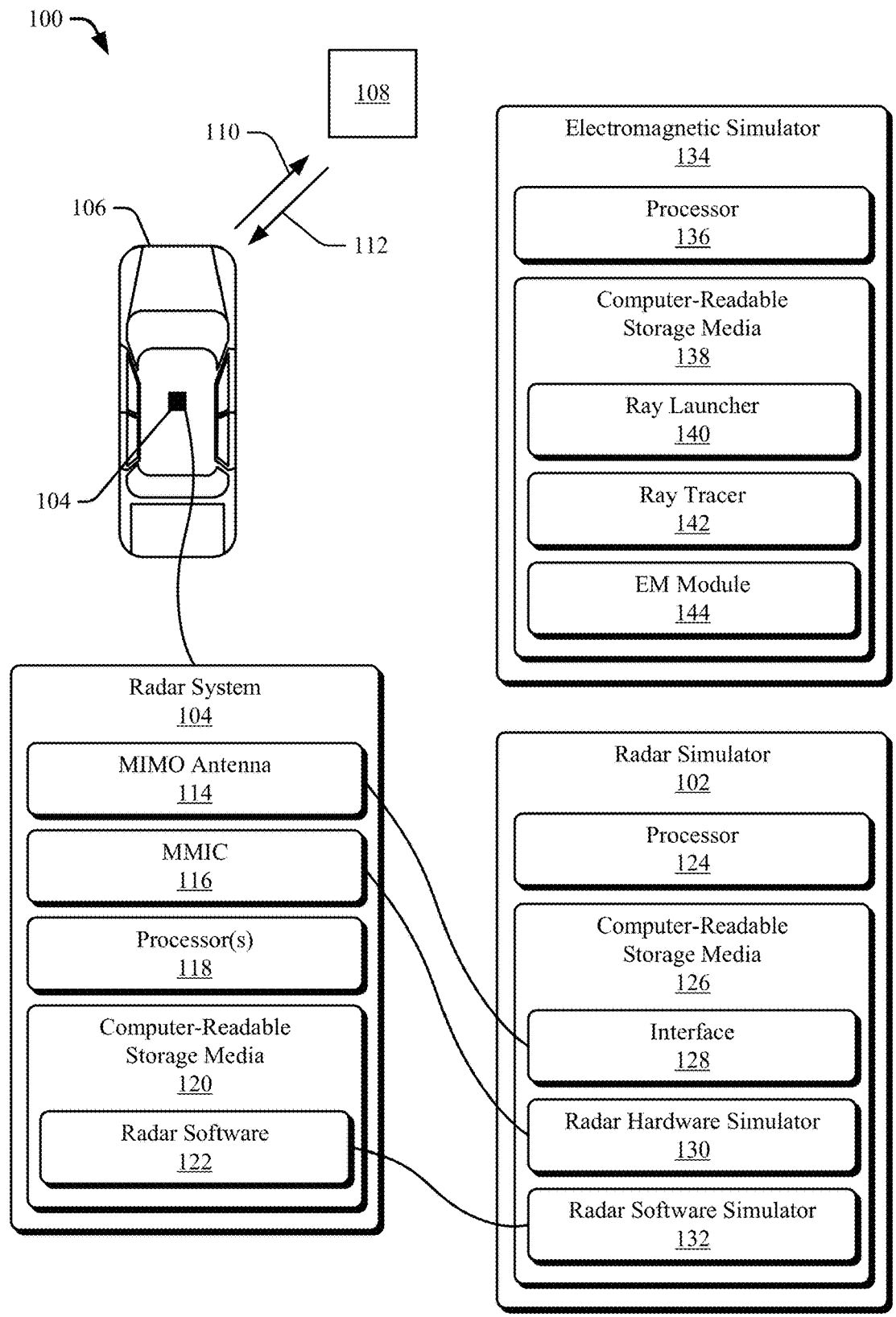
FIG. 1 illustrates an example environment in which a radar simulator models one or more components of a radar system using accurate and efficient electromagnetic response for a sensor simulator, in accordance with techniques of this disclosure.

An automotive radar environment simulation tool uses a computer to simulate wave propagation and scattering phenomenon of millimeter wave (MMW) radar signals in a traffic scene, as well as simulate the propagation of such signals through the radar hardware and processing by the software backend. Compared to a road test, radar environment simulation is much less expensive, and easier to repeat for some critical scenarios. Likewise, it can provide a deep insight into the interaction between the environment and the radar signals, and therefore, it can benefit and accelerate radar development. The propagation and scattering aspect of this simulation makes use of electromagnetic simulation.

There are many existing electromagnetic simulation methods, and they can be divided into three general categories including full-wave numerical methods, asymptotic methods, and model-based methods. Full-wave methods apply the integral equation or differential equation form of Maxwell's equations, and therefore are very accurate. However, since traffic targets are much larger than the wavelength at automotive radar frequencies, these methods are computationally prohibitively expensive and extremely slow. Their time complexity is around $O(n^3)$, or $O(n^2 \log(n))$ if some acceleration technique is applied. Model-based methods pre-calculate the electromagnetic response from different targets, and then use post-processing to estimate the aggregated response from a dynamic simulation scene. It usually disregards multipath effects, and it is the fastest method (e.g., time complexity of $O(n)$) while sacrificing on accuracy.

Asymptotic numerical methods assume that the electromagnetic wave propagation and scattering process is similar to that of light at MMW frequencies. Some examples of asymptotic methods include the geometric optics (GO) method, the physical optics (PO) method, and the shooting and bouncing rays (SBR) method. The SBR method can be considered as a combination of GO and PO. Wave propagation is described by the ray-tracing method (GO approximation), and wave scattering is calculated by the PO approximation. It has a good balance between simulation accuracy and efficiency (e.g., time complexity of $O(n*\log(n))$).

The SBR method is often used to compute the radar cross section (RCS) of targets placed in the far-range. The process of the traditional SBR method includes multiple steps. First, the geometry of the targets is discretized into small facets, and an acceleration data structure is built to sort those facets. Next, uniformly distributed rays are launched towards the targets, and a ray tracing algorithm is applied to find the propagation of rays and intersecting positions between rays and targets. Finally, the scattered fields for each ray and at each bouncing point can be computed with PO and combined to further calculate the RCS of the targets.

However, SBR methods can have drawbacks. One drawback is that the SBR method alone does not accurately compute vertical multipath effects. There are three key issues related to this drawback. The first issue is that the scattered electric fields (E fields) that get reflected by the ground may not be captured in the calculation if the towards-ground scattered direction is not the specular reflection direction on the illuminated surface. Another issue is that the ray density is related to the simulation accuracy, and the rays shot to the ground or to another large reflector and reflected towards the target may have ray density that is too sparse for accurate computation. A third issue is that in some of the existing SBR methods, the road surface is considered as a target and an excessive number of rays are launched to cover the entire road, which results is a high increase in computational cost in terms of resources and execution time.

Another drawback is the effect of horizontal multipaths is not accurately computed. One reason is similar to that described above for the vertical multipath case, where the ray density after reflection is too low (e.g., rays are too sparse). Additionally, weak responses from targets, such as the reverse paths and the reciprocal paths, are omitted. These weak responses exist physically and may be interpreted by a real radar as a ghost target. Including them in the electromagnetic model is key to maintaining a high degree of fidelity in the simulation.

A third drawback is that in a dynamic scene simulation, the acceleration data structure for the facets of the targets are generated for every frame, resulting in increased processing time and resources.

In contrast, the techniques and systems described in this document overcome these drawbacks. To overcome the problem of inaccurate vertical multipath effect, image theory and ray tracing is combined with the SBR method. Image theory and ray tracing can consider the vertical multipath effect while excluding examining waves that would not be sensed (e.g., waves occluded by the physical characteristics of a target, waves bouncing off the ground but not reflected back towards the sensor).

The problem of inaccurate horizontal multipath effects can be improved by using an adaptive ray-launching process and examining additional reverse scattering paths and reciprocal paths that an electromagnetic ray may follow. The adaptive ray-launching process determines targets in a far-range that may ordinarily receive a much lower spatial ray density than closer targets. This process increases the ray density launched towards the targets in the far-range as well as the targets illuminated by multipath. The adaptive ray-launching process, likewise, can determine rays that would not reflect back towards the sensor and does not analyze them. Examining additional reverse scattering paths and reciprocal paths that an electromagnetic ray may follow with the adaptive ray-launching process enables multipath effects, that are often left out of analysis, to be considered.

The problem of inefficient dynamic scene simulation can be improved using a modified ray-tracing process where acceleration data structures are reusable for different frames of a simulation and different targets with the identical geometry in a scene. Additionally, a simplified large element PO formulation for rays with parallelogram-shaped footprints can be applied to reduce the ray density while maintaining a good accuracy.

As described herein, the electromagnetic simulator may use both the central processing unit and the graphical processing unit of a computer to generate the electromagnetic response from a traffic scene. The scene information (e.g., position, orientation, and velocity for all targets) and basic parameters of the transmitter/receiver (position, orientation, field-of-view, and operating frequency) are taken as inputs. The output is composed of clustered rays that contain the polarimetric electromagnetic response from different portions of all detectable targets. The simulation process will be described with reference to FIG. 3. Further, the techniques and systems are generally described in this document in the context of radar sensors and radar simulators. However, the described techniques and systems can be used to evaluate electromagnetic response for any high frequency application (e.g., microwave applications, Wi-Fi, cellular phone applications).

By using the above-summarized techniques, vertical and horizontal multipath effects can be included in the electromagnetic model. Additionally, electromagnetic rays that are not detected may not be analyzed. Acceleration data structures can be reused without first recalculating for every frame of a simulation. In this manner, an accurate and efficient electromagnetic response model can be generated to be used by a sensor simulator.

Example Environment

FIG. 1 illustrates an example environment 100 in which a radar simulator 102, using accurate and efficient electromagnetic response for a sensor simulator, models one or more components of a radar system 104, in accordance with techniques of this disclosure. In the depicted environment 100, the radar system 104 is mounted to, or integrated within, a vehicle 106. The radar system 104 is capable of detecting one or more targets 108 that are proximate to the vehicle 106 and associated with a signal-to-noise ratio that is greater than a detection threshold of the radar system 104. Although illustrated as car, the vehicle 106 can represent other types of motorized vehicles (e.g., a motorcycle, a bus, a tractor, a semi-trailer truck, or construction equipment), types of non-motorized vehicles (e.g., a bicycle), types of railed vehicles (e.g., a train or a trolley car), watercraft (e.g., a boat or a ship), aircraft (e.g., an airplane or a helicopter), or spacecraft (e.g., satellite). In general, the radar system 104 can be mounted to any type of moving platform, including moving machinery or robotic equipment.

In the depicted implementation, the radar system 104 is mounted on top of the vehicle 106. In other implementations, the radar system 104 can be mounted to an underside, a front side, a backside, a left side, or a right side of the vehicle 106. In some cases, the vehicle 106 includes multiple radar systems 104, such as a first rear-mounted radar system 104 positioned near a left side of the vehicle 106 and a second rear-mounted radar system 104 positioned near a right side of the vehicle 106. In general, locations of the one or more radar systems 104 can be designed to provide a particular field of view that encompasses a region of interest in which the target 108 may be present. Example fields of view include a 360-degree field of view, one or more 180-degree fields of view, one or more 90-degree fields of view, and so forth, which can overlap (e.g., four 120-degree fields of view).

The target 108 is composed of one or more types of material that reflect radar signals. Depending on the application, the target 108 can represent a target of interest or clutter. In some cases, the target 108 is a moving target, such as another vehicle, a human, or an animal. In other cases, the target 108 is a stationary target, such as a continuous or discontinuous road barrier (e.g., a traffic cone, a concrete barrier, a guard rail, or a fence), a tree, or a parked vehicle.

The vehicle 106 can implement one or more radar-based systems, which utilize data provided by the radar system 104. Example types of radar-based systems include a driver-assistance system or an autonomous-driving system. Using the data provided by the radar system 104, the driver-assistance system can monitor one or more blind spots of the vehicle 106 and alert a driver to a potential collision with the target 108. The autonomous-driving system can move the vehicle 106 to a location while analyzing data provided by the radar system 104 to avoid collisions with other targets 108, perform emergency braking, change lanes, or adjust the vehicle 106's speed.

The radar system 104 can be implemented as a continuous-wave or pulsed radar, a frequency-modulated or phase-modulated radar, a single-input single-output (SISO) or a multiple-input multiple-output (MIMO) radar, or some combination thereof. In the depicted configuration, the radar system 104 is implemented as a frequency-modulated continuous-wave (FMCW) MIMO radar, which employs a code-division multiple access (CDMA) scheme. To detect the target 108, the radar system 104 transmits at least one radar transmit signal 110. At least a portion of the radar transmit signal 110 is reflected by the target 108. This reflected portion represents a radar receive signal 112. The radar system 104 receives the radar receive signal 112 and processes the radar receive signal 112 to provide data for the vehicle 106's radar-based system.

To transmit the radar transmit signal 110 and receive the radar receive signal 112, the radar system 104 includes at least one MIMO antenna 114 and at least one monolithic microwave integrated circuit (MMIC) 116. The MMIC 116 includes circuitry and logic for transmitting and receiving radar signals via the MIMO antenna 114. Components of the MMIC 116 can include amplifiers, mixers, switches, analog-to-digital converters, or filters for conditioning the radar signals. The MMIC 116 also includes logic to perform in-phase/quadrature (I/Q) operations, such as modulation or demodulation. The MMIC 116 can include at least one transmitter and at least one receiver.

Using the MIMO antenna 114, some implementations of the radar system 104 can form beams that are steered or un-steered, and wide or narrow. The steering and shaping can be achieved through analog beamforming or digital beamforming. The one or more transmitting subarrays can have, for instance, an un-steered omnidirectional radiation pattern or can produce a wide steerable beam to illuminate a large volume of space. To achieve target angular accuracies and angular resolutions, the receiving subarrays can include multiple receive antenna elements to generate hundreds of narrow steered beams with digital beamforming. In this way, the radar system 104 can efficiently monitor an external environment and detect one or more targets 108 within a region of interest.

The radar system 104 also includes one or more processors 118 and computer-readable storage media (CRM) 120. The CRM 120 includes radar software 122 for analyzing the radar receive signal 112, detecting the target 108, and determining one or more characteristics (e.g., position or velocity) of the target 108.

The radar simulator 102 models hardware and/or software of the radar system 104 to enable performance of the radar system 104 to be evaluated for a given simulated environment. Throughout a development cycle of the radar system 104, the radar simulator 102 can be used to evaluate different system designs (e.g., different hardware configurations or different operational modes), test different versions of the radar software 122, or verify requirements, for instance. Use of the radar simulator 102 enables design or implementation problems within the radar system 104 to be quickly discovered during design, integration, and testing phases prior to performing a live test.

The radar simulator 102 performs operations to simulate the hardware of the radar system (e.g., parts of the MIMO antenna 114 and/or MMIC 116), the radar software 122 executed by the processor 118, or a combination thereof. The radar simulator 102 can also account for non-ideal characteristics of the radar system 104 or the environment 100, such as noise or non-linearities. In particular, the radar simulator 102 can model phase noise, waveform non-linearities, and uncorrelated noise within the MMIC 116. With these capabilities, the radar simulator 102 can have a similar noise floor and dynamic range as the radar system 104.

The radar simulator 102 includes at least one processor 124 and computer-readable storage media 126. The CRM 126 can be implemented by one or more memory devices that enable persistent and/or non-transitory data storage. In some cases, the processor 124 and the CRM 126 are packaged together within an integrated circuit or on a printed circuit board. In other cases, the processor 124 and the CRM 126 can be implemented separately and operationally coupled together such that the processor 124 can access instructions stored by the CRM 126.

The CRM 126 includes at least one interface module 128 and at least one radar hardware simulator 130. Optionally, the CRM 126 can also include at least one radar software simulator 132. The interface module 128, the radar hardware simulator 130, and the radar software simulator 132 can be implemented using hardware, software, firmware, or a combination thereof. In this example, the processor 124 implements the interface module 128, the radar hardware simulator 130, and the radar software simulator 132.

Figures 1, 2:
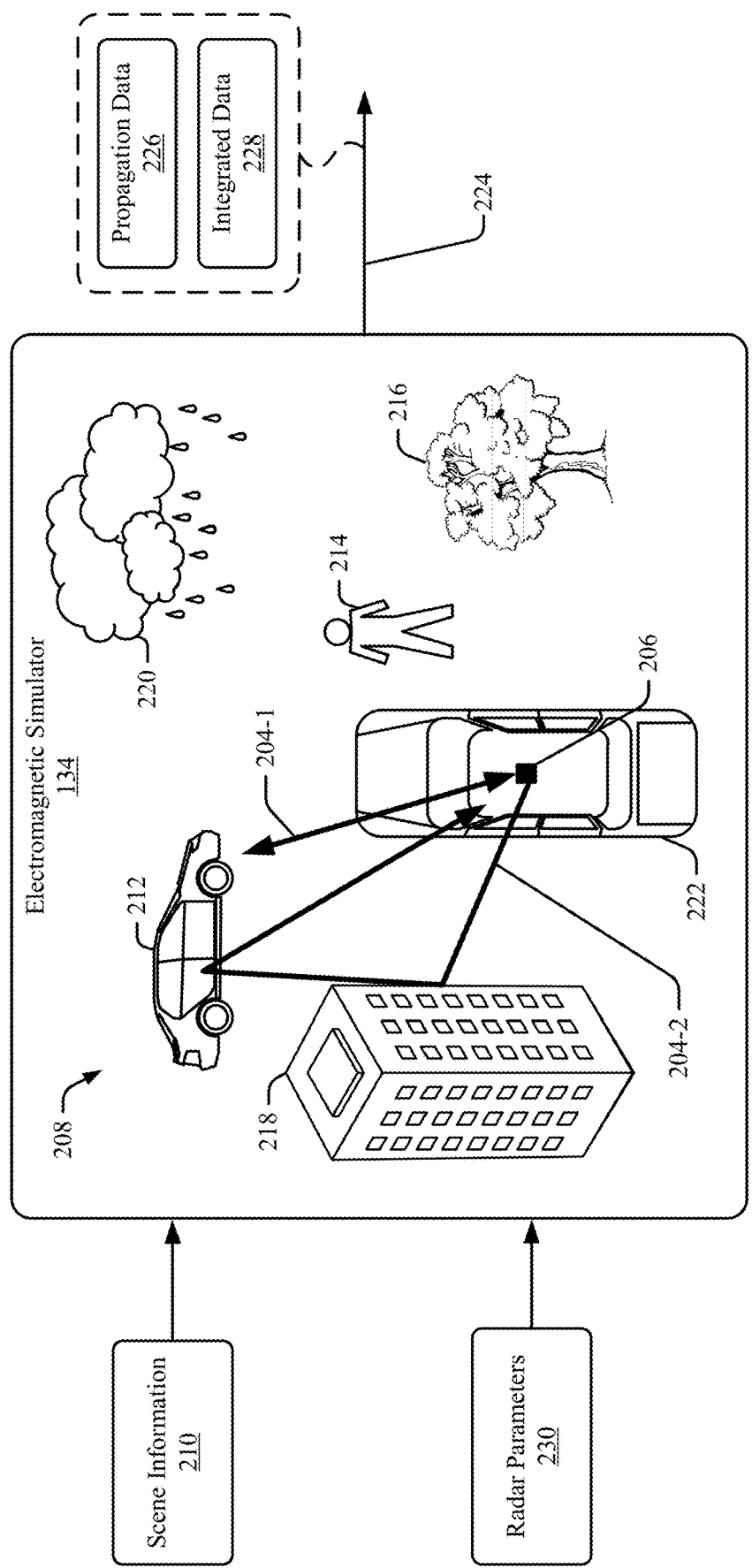
Figure 2:
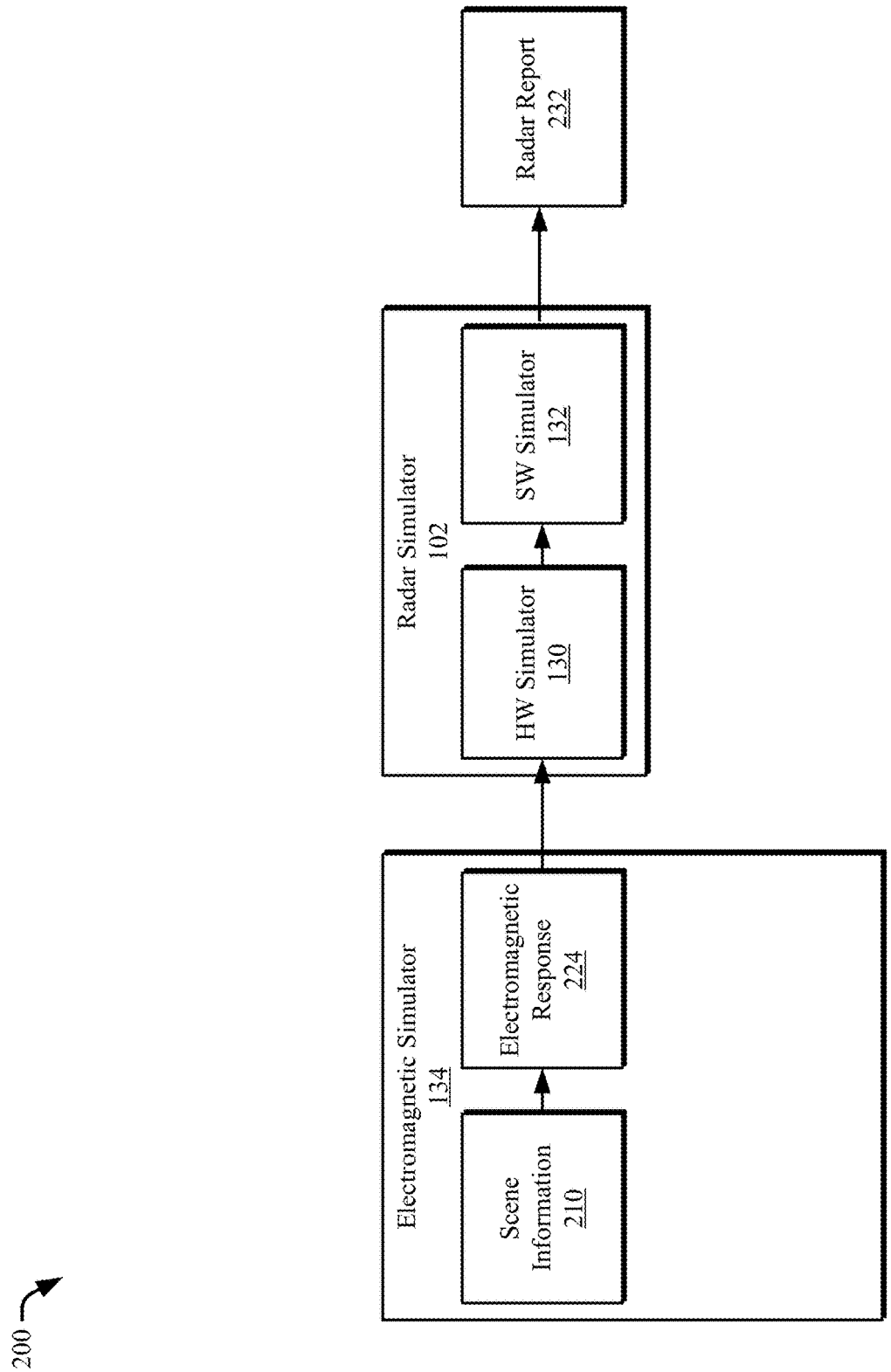

The interface module 128 enables the radar simulator 102 to process environmental response data provided by an electromagnetic simulator (shown in FIG. 2). Generally, the interface module 128 transforms the environmental response data into a form that is useable by the radar hardware simulator 130. In some cases, the interface module 128 adjusts the environmental response data to account for an antenna response of the MIMO antenna 114.

The radar hardware simulator 130 models the MMIC 116. In particular, the radar hardware simulator 130 performs operations that simulate waveform generation, modulation, demodulation, multiplexing, amplification, frequency conversion, filtering, and/or analog-to-digital conversion operations performed by the MMIC 116. In other words, the radar hardware simulator 130 performs operations of the MMIC 116, which occur between the processor 118 and the MIMO antenna 114. The radar hardware simulator 130 can account for the radar system 104's dynamic range, as well as the presence of non-linear effects and noise. The radar hardware simulator 130 can be used to verify different hardware configurations and operational modes of the radar system 104.

The radar software simulator 132 models the radar software 122 of the radar system 104. In particular, the radar software simulator 132 performs digital baseband processing operations that simulate operations performed by the processor 118. These operations can include Fourier transforms (e.g., Fast Fourier transform), noise floor estimation, clutter map generation, constant-false alarm rate thresholding, object detection, and object position estimation (e.g., digital beamforming). In some cases, the radar software simulator 132 includes a version of the radar software 122. In this way, the radar simulator 102 can be used to verify software requirements and evaluate different software versions of the radar system 104.

During operation, the radar simulator 102 accepts electromagnetic response data from an electromagnetic simulator 134 and generates a radar report. The radar report can be used to evaluate performance of the radar system 104 for a given simulated environment. By providing accurate electromagnetic response data, the electromagnetic simulator 134 may enable the performance of the radar system 104 to be reliably evaluated.

The electromagnetic simulator 134 includes at least one processor 136 and computer-readable storage media 138. The CRM 138 can be implemented by one or more memory devices that enable persistent and/or non-transitory data storage. In some cases, the processor 136 and the CRM 138 are packaged together within an integrated circuit or on a printed circuit board. In other cases, the processor 136 and the CRM 138 can be implemented separately and operationally coupled together such that the processor 136 can access instructions stored by the CRM 138.

The CRM 138 includes a ray launcher 140 and a ray tracer 142. The CRM 138 also includes an electromagnetic (EM) module 144. The ray launcher 140, the ray tracer 142, and the EM module 144 can be implemented using hardware, software, firmware, or a combination thereof. In this example, the processor 136 implements the ray launcher 140, the ray tracer 142, and the EM module 144.

The ray launcher 140 enables the electromagnetic simulator 134 to adaptively launch electromagnetic rays in a simulation. The ray tracer 142 enables the electromagnetic simulator to trace rays, including the reflections of the rays from targets in the simulation. The EM module 144 calculates the electromagnetic response of each the traced rays. The ray launcher 140, the ray tracer 142, and the EM module 144 are discussed in more detail below.

FIG. 2-1 illustrates an example electromagnetic simulator 134 that generates accurate and efficient electromagnetic response for a sensor simulator. The electromagnetic simulator 134 evaluates the propagation and scattering effects of a simulated electromagnetic signal, such as a radio-frequency signal. In general, the electromagnetic simulator 134 evaluates one or more propagation paths 204 that originate from a reference point 206 and return to the reference point 206 within a simulated environment 208. Example types of propagation paths 204 can include a direct line-of-sight path 204-1 or an indirect path 204-2 associated with multipath propagation. In some cases, the electromagnetic simulator 134 uses ray tracing to determine the various propagation paths 204. Multipath propagation and the associated paths are further described with respect to FIGS. 2-3 and 2-4.

During operation, the electromagnetic simulator 134 determines characteristics of the different propagation paths 204 within the simulated environment 208. In particular, the electromagnetic simulator 134 accepts scene information 210, which specifies characteristics of one or more simulated targets (e.g., positions, orientations, velocities, and/or material composition of the simulated targets). The electromagnetic simulator 134 generates the simulated environment 208 based on the scene information 210.

As an example, the simulated environment 208 includes simulated versions of a vehicle 212, a human 214, a tree 216, and a building 218. The scene information 210 can also enable the electromagnetic simulator 134 to simulate different types of weather 220, terrain, road geometries, traffic rules, and traffic conditions. In some cases, the scene information 210 specifies motion of the reference point 206. In the simulated environment 208, the reference point 206 represents a location on a simulated vehicle 222, which can correspond to the location of the radar system 104 on the vehicle 106 of FIG. 1.

The electromagnetic simulator 134 generates environmental response data 224, which can vary over time as the reference point 206 or the targets within the simulated environment 208 move. The electromagnetic response data 224 can include complex data with amplitude, phase, and frequency information. The electromagnetic simulator 134 may rely on information regarding the radar system 104 to generate the environmental response data 224. Example types of information regarding the radar system 104 can include position, orientation, field of view, and operating frequency of the radar system 104.

As an example, the electromagnetic simulator 134 can launch electromagnetic rays in several directions and use ray tracing to generate the electromagnetic response data 224. To improve efficiency, the rays can be transmitted and received from the reference point 206, which can represent a center of the radar system 104. The propagation paths including multipath effects can be examined. The electromagnetic simulator 134 may exclude propagation paths that do not reflect back to the reference point 206 when generating the electromagnetic response data 224. By including multipath effects and excluding the paths that do not reflect back to the reference point 206, the electromagnetic simulator 134 may accurately model electromagnetic energy that a radar system may detect in the real world. The electromagnetic simulator 134 also uses acceleration data structures based on computer-aided design (CAD) models (e.g., indicative of a geometric profile) of the simulated targets. The acceleration data structures include information about the facets of the targets. Targets employing the same CAD models can use the same pre-calculated acceleration data structures. For example, multiple vehicles 212 may use the same pre-calculated acceleration data structures. Further, if the geometric profiles of the targets are static, the pre-calculated acceleration data structures are not recalculated for a duration of the simulation. That is, the pre-calculated acceleration data structure may be used for a portion of the simulation or for the whole simulation (e.g., each frame of the simulation). The acceleration data structures for targets with dynamic geometric profiles (e.g., human 214) are recalculated for each frame. This enables more efficient use of computational resources.

The electromagnetic simulator 134 may provide propagation data 226 as the electromagnetic response data 224. The propagation data 226 includes a list of propagation paths 204 (e.g., rays) and characteristics of electromagnetic signals that propagate along the propagation paths 204. These characteristics can include relative amplitude, Doppler-frequency shift, time of flight, or angles of departure and arrival. In this example, the electromagnetic simulator 134 can generate the propagation data 226 without relying on information regarding the radar system 104.

The electromagnetic simulator 134 may provide integrated data 228 as the electromagnetic response data 224. Instead of including information regarding individual propagation paths 204, the integrated data 228 represents a combined environmental response resulting from the multiple propagation paths 204 for at least one transmit-receive channel pair. To generate the integrated data 228, the electromagnetic simulator 134 accepts radar parameters 230 during operation. The radar parameters 230 provide information regarding the radar system 104 or the radar transmit signal 110. The default radar parameters may specify an ideal antenna response or ideal waveform characteristics.

The electromagnetic simulator 134 passes the electromagnetic response data 224 to the radar simulator 102 (of FIG. 1), as further described with respect to FIG. 2-2.

FIG. 2-2 illustrates an example sequence flow diagram 200 of the electromagnetic simulator 134 outputting accurate and efficient electromagnetic response for a sensor simulator to the radar simulator 102. The electromagnetic simulator 134 simulates the environment 208 based on the scene information 210. Using the techniques described herein, the electromagnetic simulator 134 can output highly accurate electromagnetic response data 224 to the hardware simulator 130 and/or the software simulator 132 of the radar simulator 102. During operation, the radar simulator 102 analyzes the electromagnetic response data 224 and generates a radar report 232, which can be used to evaluate the performance of the radar system 104 for the simulated environment 208. Different types of radar reports 232 may be possible. In general, the radar report 232 represents any type of data that can be generated by the radar system 104. This can include samples of signals received by the MMIC 116, information processed by the processor 118, or information passed to a radar-based system of the vehicle 106.

Figures 2, 3:
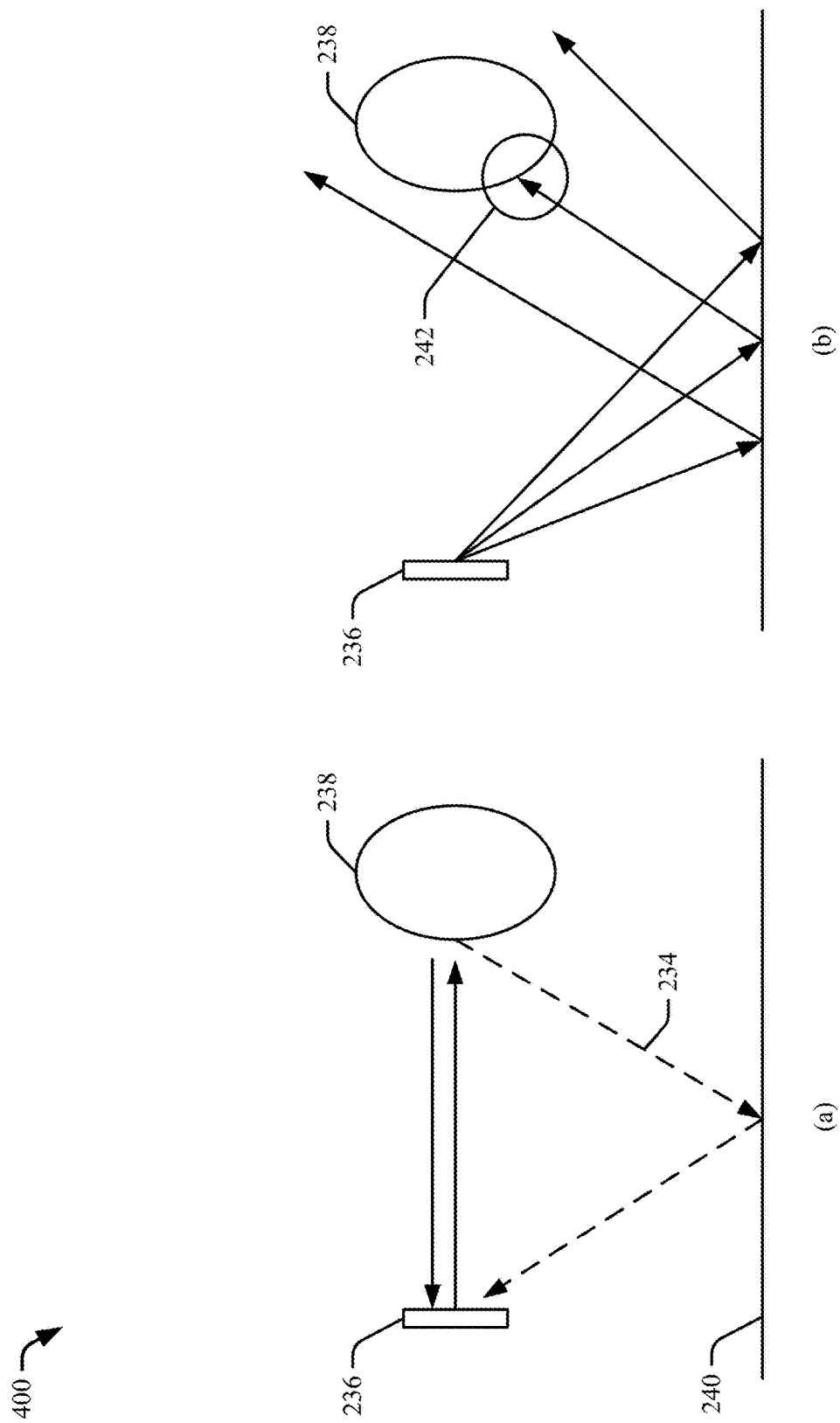
Figures 2, 3, 4:
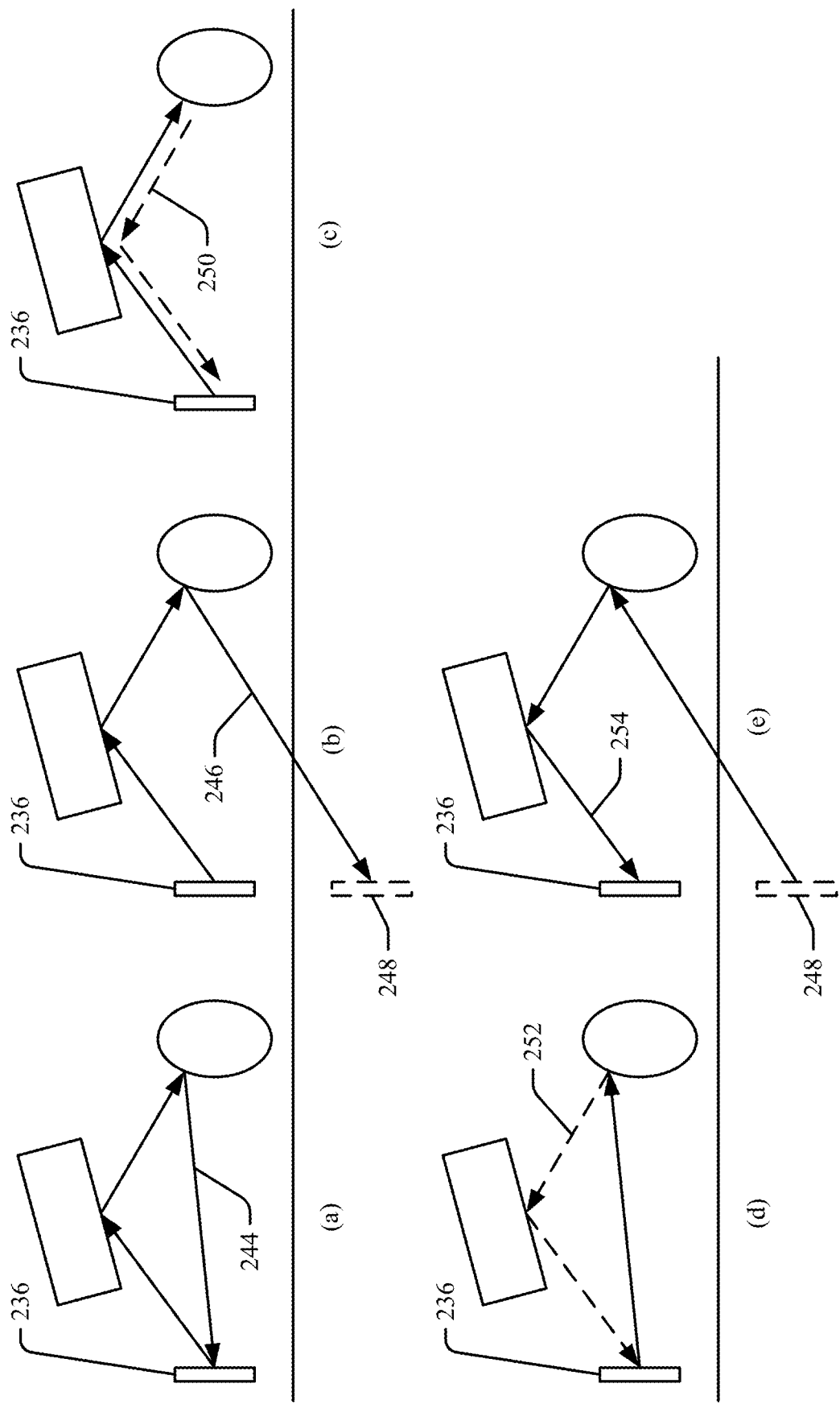
Figure 3:
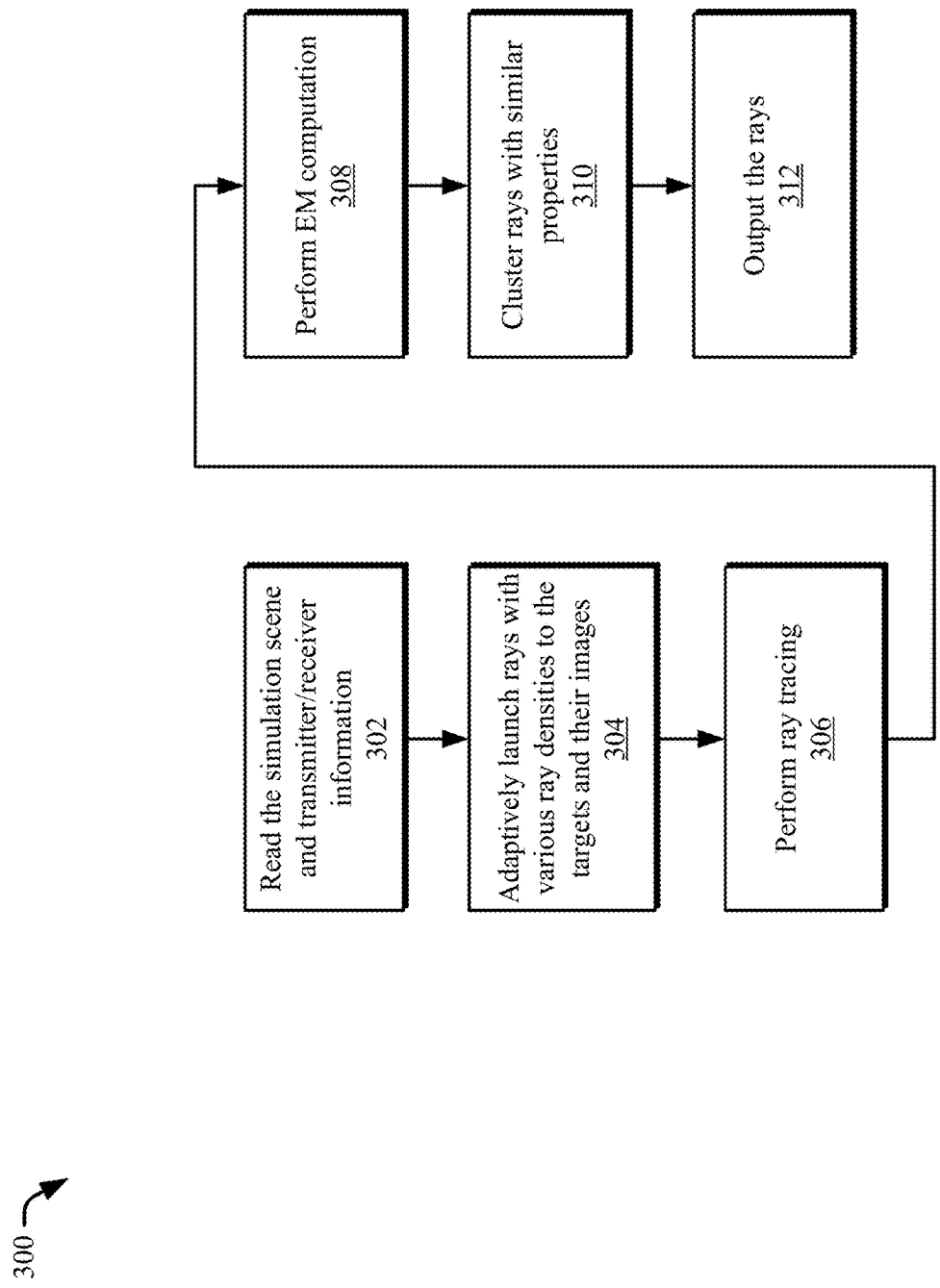
Figures 1, 4:
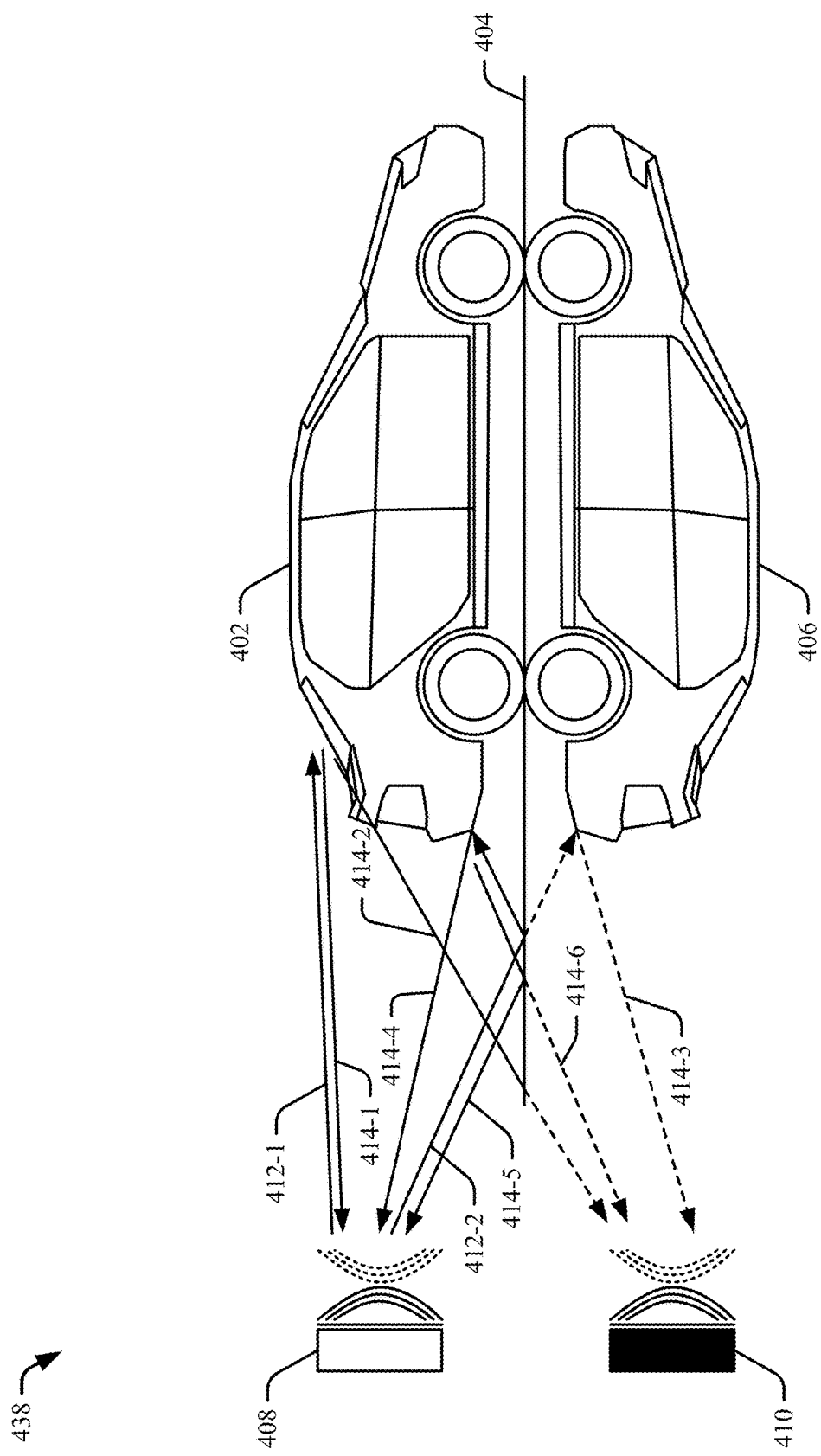
Figures 2, 4:
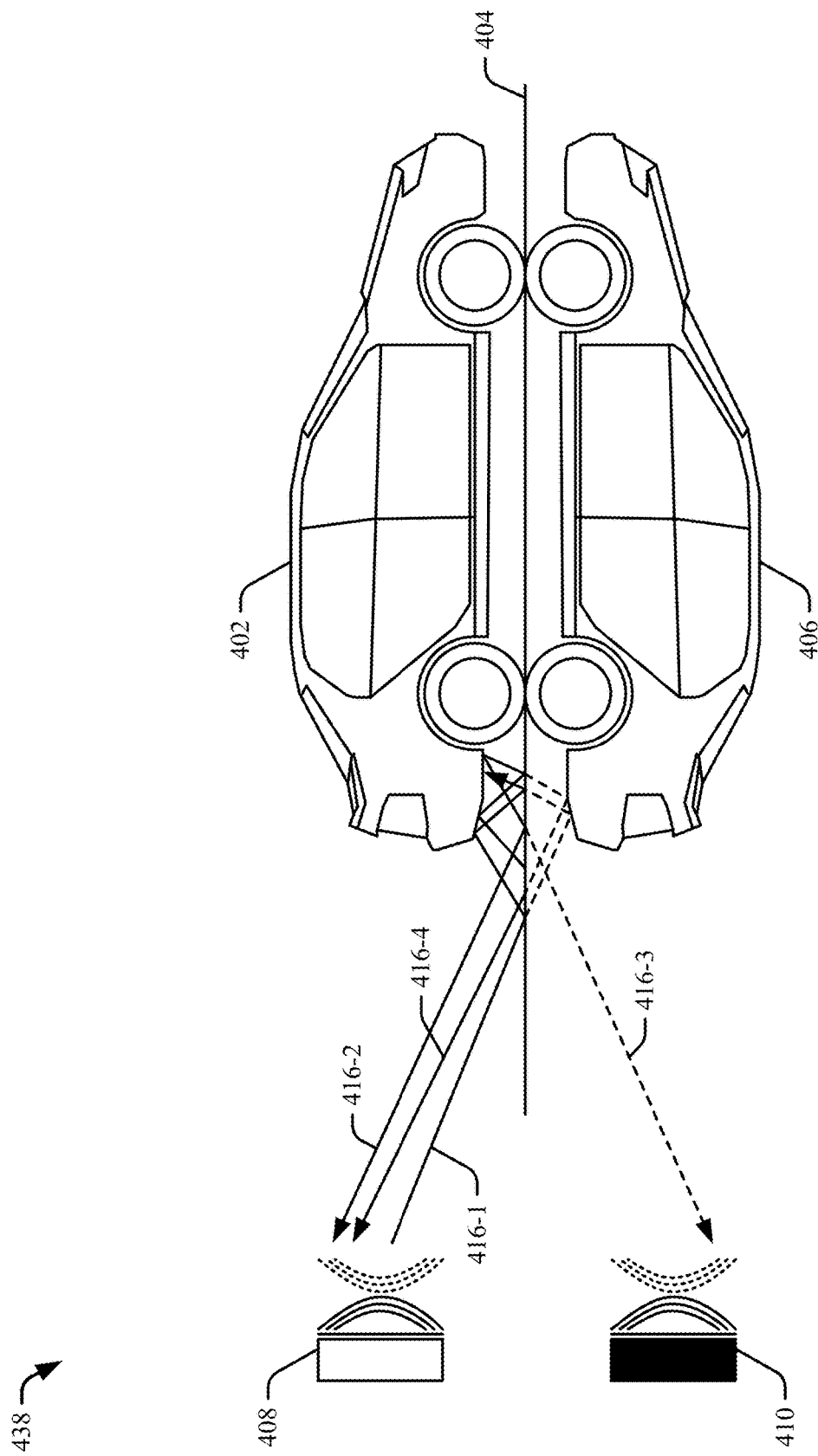

FIGS. 2-3 and 2-4 illustrate propagation paths and ray densities that are considered by the electromagnetic simulator 134 using techniques for accurate and efficient electromagnetic response for a sensor simulator. As illustrated in FIG. 2-3(a), a propagation path (e.g., scattered E field) 234, originating at a transceiver 236, that reflects off a target 238 and a ground plane 240 is considered by the electromagnetic simulator 134. FIG. 2-3(b) illustrates a sparse ray density 242 on a target 238 may be too sparse and not accurately model electromagnetic reflections in the real world. In this case, the electromagnetic simulator 134 can detect this deficiency and launch rays with a higher ray density towards the target 238.

The electromagnetic simulator 134 considers five propagation paths with multipath effects as illustrated in FIG. 2-4. FIG. 2-4(a) illustrates a path 244 reflecting directly back to the transceiver 236 if the path is not blocked by other facets. FIG. 2-4(b) illustrates a path 246 that reflects back to the transceiver image 248. This is equivalent to a path that reflects off the ground and to the transceiver 236. In FIG. 2-4(c), a path 250 reverses back over an incident path. This path 250 is considered if it is not the specular reflection direction of the target. FIGS. 2-4(d) and (e) are the reciprocals of the paths 244 and 246 illustrated in FIGS. 2-4(a) and (b), respectively. That is, the paths 252 and 254 have the same electromagnetic responses as the paths 244 and 246, respectively, but are in opposite directions of departure and arrival (e.g., inverse paths). By evaluating these extra five paths, the electromagnetic simulator 134 can more accurately simulate the real world.

Example Implementations

FIG. 3 illustrates a simulation process 300 generating accurate and efficient electromagnetic response for a sensor simulator. At step 302, the simulation scene and transmitter/receiver information are read by a ray launcher (e.g., the ray launcher 140 in FIG. 1). The scene information may include position, orientation, and speed for all the targets to be simulated. The geometric profile of each target may also be included in the scene information. The transmitter/receiver information may include some basic parameters including position, orientation, field of view, and operating frequency.

At step 304, electromagnetic rays with various ray densities are launched by the ray launcher towards the targets and their images. The ray density in a specific direction is determined by the range of the targets potentially hit by the electromagnetic ray. The images of the targets are reflections of the targets about a ground plane. In the simulation, the ground plane may be the ground, or it may be some other barrier (e.g., a building, a guardrail, any surface contributing to multipath reflections) in the simulation that reflects electromagnetic rays. One method of creating and analyzing images of sensors, targets, and scattered E fields utilizes electromagnetic image theory. The adaptive ray-launching process is further described with respect to FIGS. 5-1 through 5-4

At step 306, ray tracing is performed by a ray tracer (e.g., the ray tracer 142 in FIG. 1). This step incorporates a modified ray-tracing process to compute where the rays hit and reflect. The modified ray-tracing process is further described with respect to FIGS. 6-1 and 6-2

At step 308, electromagnetic calculations are performed by an EM module (e.g., the EM module 144 in FIG. 1). The EM module computes the polarimetric electromagnetic response for each ray. Processes of the EM module are further described with respect to FIG. 7.

At step 310, the electromagnetic rays with similar properties are combined as clustered rays. The clustered rays are then output to a sensor simulator at step 312.

FIGS. 4-1 and 4-2 illustrate an example implementation using a modified SBR method for accurate and efficient electromagnetic response for a sensor simulator. The modified SBR method determines electromagnetic rays interacting with a target 402. The electromagnetic rays can have forward propagation paths to the target and backward propagation paths from the target. The electromagnetic rays are determined by considering the electromagnetic rays that are launched toward a target and reflected directly back to the receiver and electromagnetic rays that include multipath effects. This method uses a GO process to approximate multipath effects created by the electromagnetic rays reflecting off the ground. In some implementations, electromagnetic image theory is employed to determine the multipath effects stemming from the ground (e.g., a ground plane) and enables an electromagnetic simulator (e.g., the electromagnetic simulator 134 in FIG. 1) to include multipath electromagnetic rays that otherwise may be overlooked.

Using electromagnetic image theory, the process includes launching initial electromagnetic rays from the radar to both a target and its image with the same spatial density. A ray-tracing process is applied to the electromagnetic rays where the electromagnetic rays bouncing between targets and their respective images are, likewise, considered in addition to direct propagation paths with no multipath effects. The scattered E fields are evaluated at the locations of both the radar and its image based on equivalent surface currents. Some of the paths for incident and scattered fields may cross the ground plane. Bulk dielectric Fresnel reflection coefficients are calculated and multiplied by the scattered fields and respective incident fields.

As illustrated in FIG. 4-1, a target image 406 of the target 402 is mirrored about a ground plane 404. Likewise, a radar sensor 408 has a respective radar sensor image 410 mirrored about the ground plane 404. Once the target image 406 and the radar sensor image 410 are determined, the ground plane 404 can be removed for ray-tracing calculations. Without the ground plane 404, ray tracing can be performed including the target image 406 and the radar sensor 410.

Electromagnetic rays 412 are launched from the radar sensor 408 to both the target 402 and the target image 406 with the same spatial ray density. The electromagnetic ray 412-1 hits the target 402 without multipathing and has a reflected electromagnetic ray 414-1 directly back to the radar sensor 408. The electromagnetic ray 412-1 may, likewise, have a reflected electromagnetic ray 414-2 directed toward the radar sensor image 410. However, the reflected electromagnetic ray 414-2 is occluded by the target 402 and will not reach the radar sensor image 410. Therefore, the reflected electromagnetic ray 414-2 can be discarded.

The electromagnetic ray 412-2 is launched towards the ground plane 404. By ignoring the ground plane 404, the electromagnetic ray 412-2 can be examined in relation to the target image 406 and the radar sensor image 410. The dotted segment of the electromagnetic ray 412-2 represents the segment that bounces off the ground plane 404 and hits the target 402 under the back bumper. The electromagnetic ray 412-2 reflects from the target image 406 directly to the radar sensor image 410 as the reflected electromagnetic ray 414-3. The electromagnetic ray 414-3 (direct path with no bounces after being reflected by the target image 406) is equivalent to the reflected electromagnetic ray 414-4 (the path of the reflected electromagnetic ray 414-4 including one bounce before being reflected by the target 402). Additionally, a reflected electromagnetic ray 414-5 reflects from the target 402 and from the ground plane 404 (one bounce after being reflected by the target 402). The reflected electromagnetic ray 414-5 can be examined as the equivalent reflected electromagnetic ray 414-6 that propagates directly from the target 402 to the radar sensor image 410 (no bounces after being reflected by the target 402).

FIG. 4-2 illustrates a launched electromagnetic ray 416-1 that includes several bounces. Similar to the electromagnetic rays illustrated in FIG. 4-1, examining the electromagnetic ray 416-1 in relation to the target image 406 and the radar sensor image 410 simplifies the calculations of the propagation paths of the electromagnetic ray 416-1. The reflected electromagnetic ray 414-2, having a bounce off the ground plane 404, can be examined as the equivalent reflected electromagnetic ray 416-3 that does not include the bounce. Additionally, the reflected electromagnetic ray 416-4 can be examined with respect to the target image 406, the path of reflected electromagnetic ray 416-4 including one bounce off the target image 406. The modified SBR method with electromagnetic image theory simplifies the calculations involving the scattered E fields and excludes any occluded electromagnetic rays.

In a non-limiting example with respect to FIGS. 4-1 and 4-2, to determine the electromagnetic rays interacting with the target 402, the target image 406 that mirrors the target 402 about the ground plane 404 is determined. The electromagnetic sensor image 410 that mirrors the electromagnetic sensor 408 is likewise determined. The electromagnetic rays 412 are launched (e.g., launched rays) from the electromagnetic sensor 408 having the same spatial ray density relative to the target 402 and the target image 406. The dielectric Fresnel reflection coefficients for the target and the ground plane are calculated based on the electromagnetic rays 412. Then the scattered fields and the respective incident fields are multiplied by the dielectric Fresnel reflection coefficients. The scattered fields are evaluated by computing the incident fields of the electromagnetic rays 412 on the target using geometrical optics. The scattered fields and equivalent surface currents of the reflected electromagnetic rays are computed using physical optics. Any electromagnetic energy (e.g., the electromagnetic rays 414-2) occluded by physical characteristics of the target are excluded. This enables only the multipath reflections in relation to the target 402 to be evaluated without evaluating occluded electromagnetic energy that the electromagnetic sensor 408 cannot detect.

Figures 1, 5:
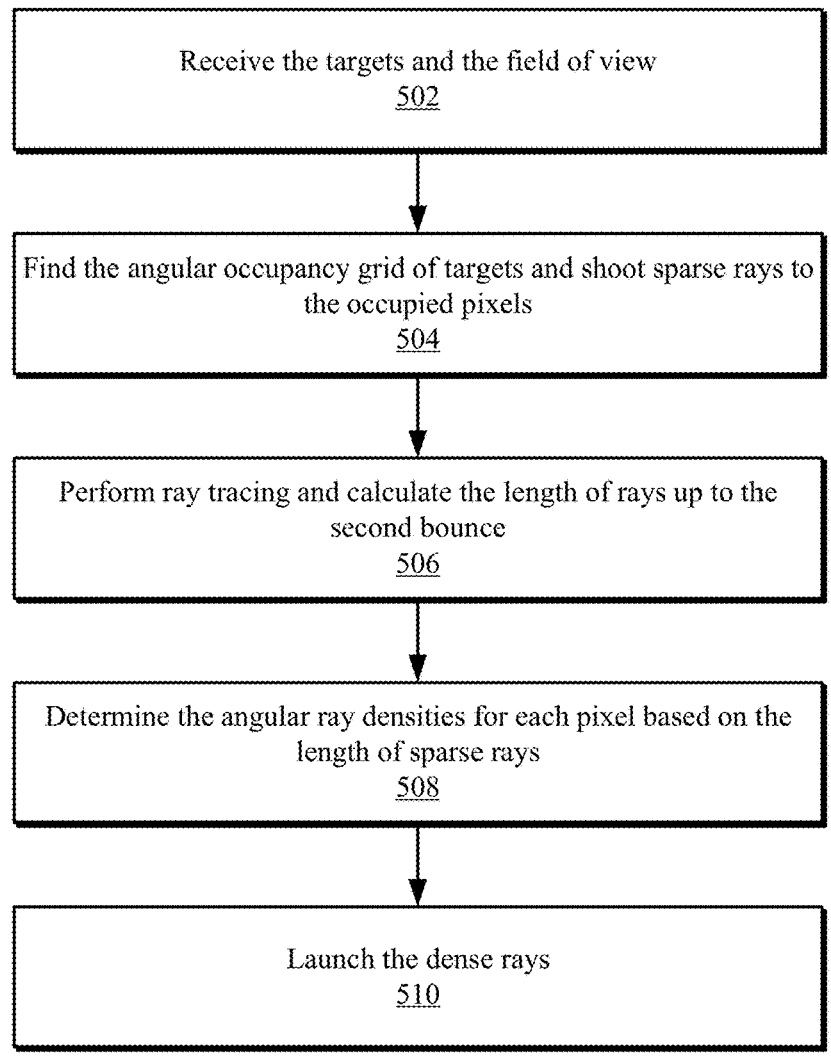
Figures 2, 5:
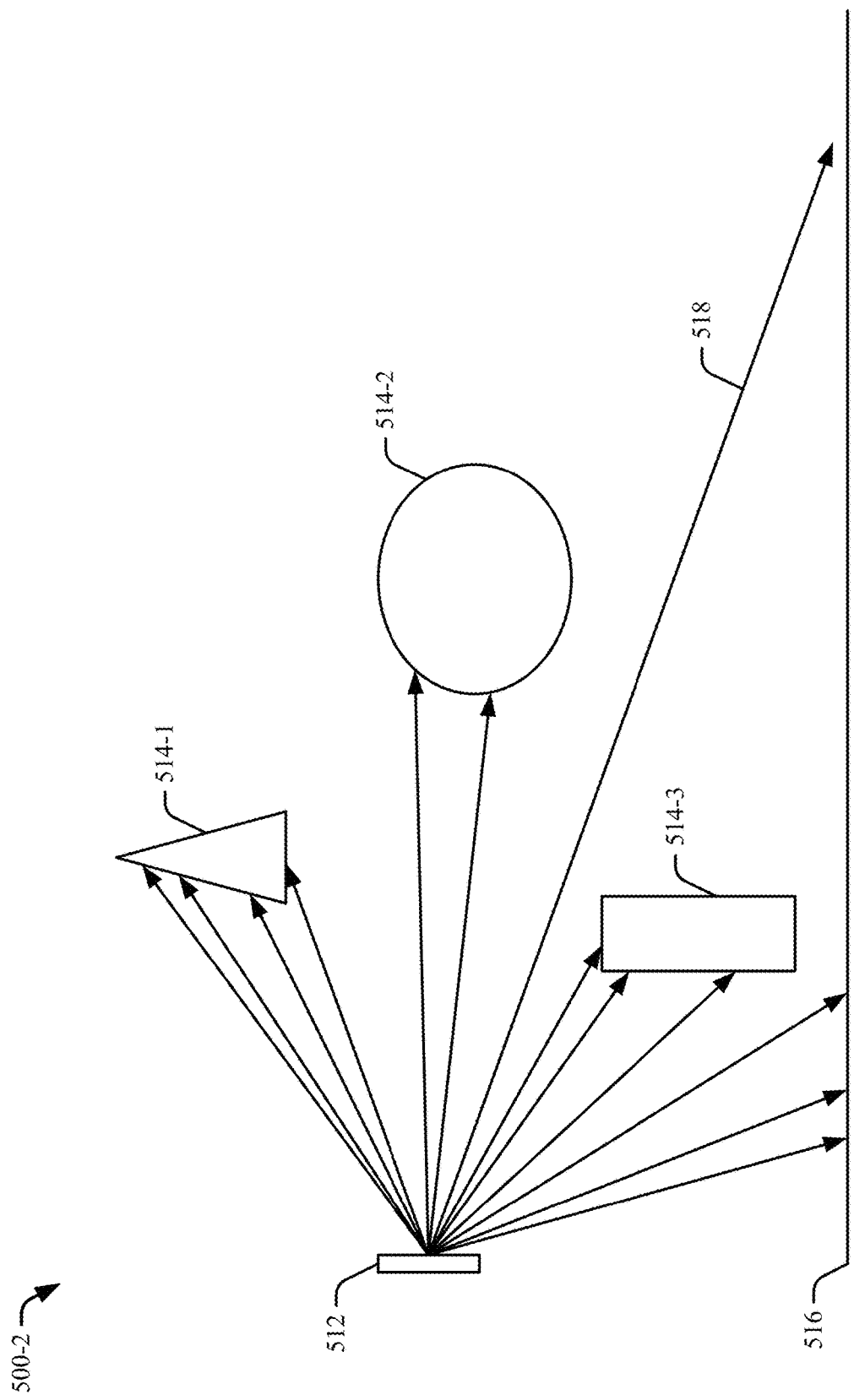
Figures 3, 5:
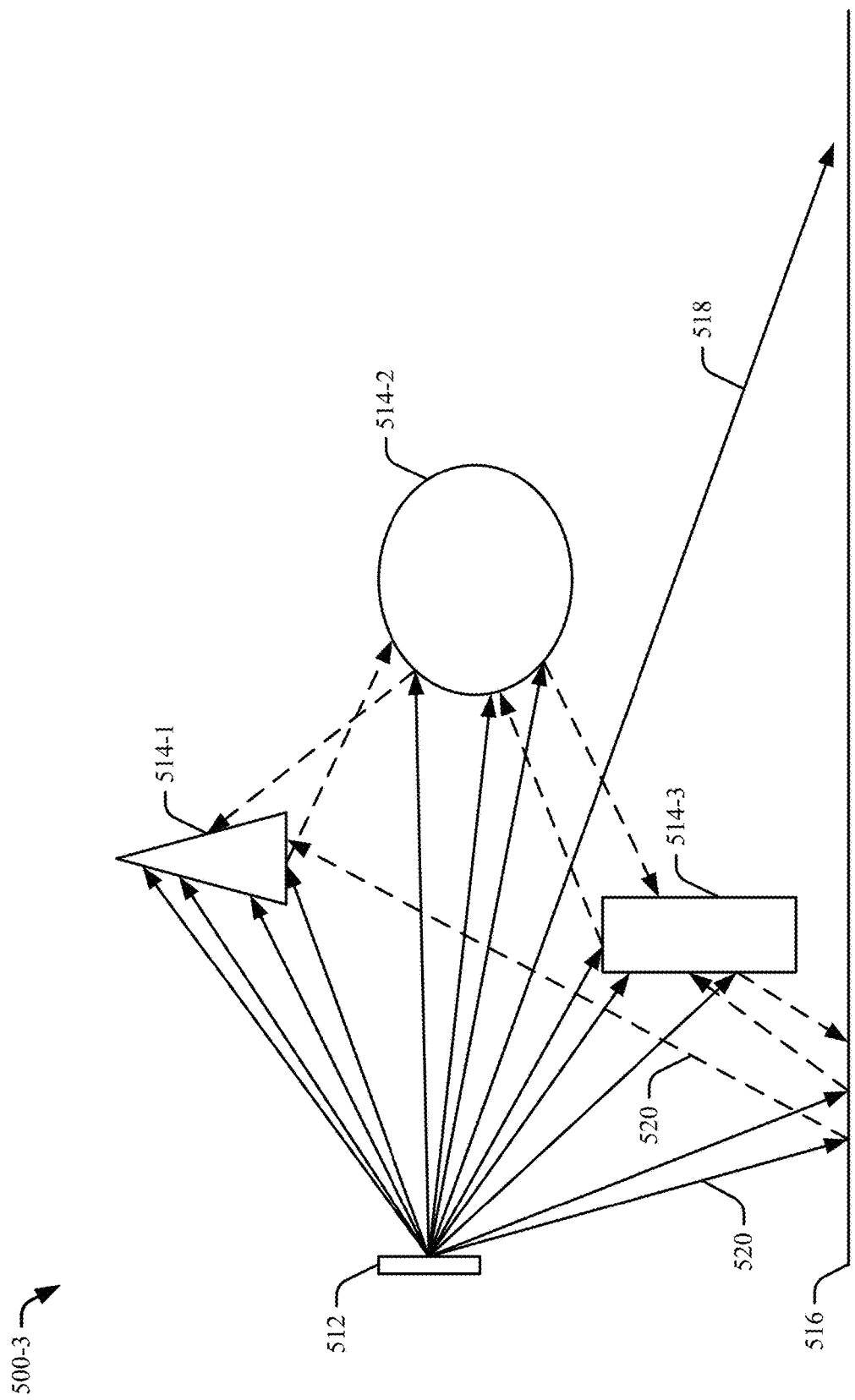
Figures 4, 5:
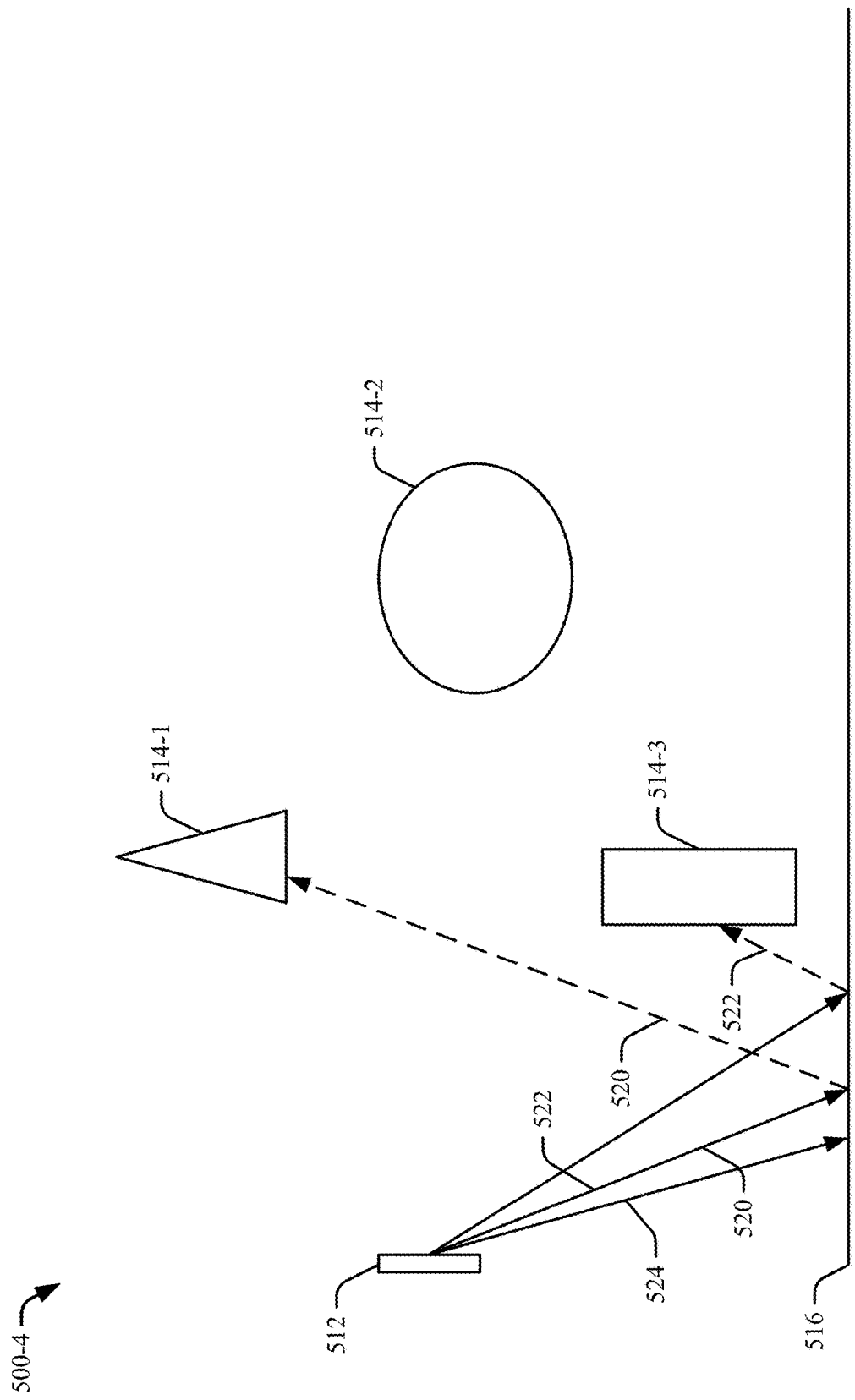

FIGS. 5-1 through 5-4 illustrate an adaptive ray-launching process 500-1 for accurate and efficient electromagnetic response for a sensor simulator. In the ray-launching process, the directions of the electromagnetic rays and their densities are determined (e.g., in the azimuth plane). This is critical for both accuracy and simulation speed since they are directly related to the complexity of the analysis. In many traditional SBR implementations, the targets are illuminated by a plane wave (they are usually very far from the source/receiver) and the ray densities across electromagnetic rays are usually kept constant as well to yield uniform accuracy across targets. The ray-launching process used in traditional SBR methods cannot be directly applied in mm-wave automotive radar applications where the radar, which has a wide angular field of view, is not necessarily in the far-range of the targets present in the traffic scene. In addition, the accuracy of the simulation is related to a desired spatial ray density $\rho_s$ on the surface of a target, and therefore the rays hitting near and far targets must have different angular ray densities to maintain the same simulation accuracy. Without considering the geometric complexity of targets, for constant accuracy, the angular ray density $\rho_\alpha$ should be a function of the length of the ray d:

$$\rho_a = \frac{\rho_s}{d} \quad (1)$$

In the adaptive ray-launching process, this length accounts for multiple bounces if multipath propagation is considered. In automotive radar applications, multipath effects from the road, large vehicles, or guardrails are very common and significant, and they are addressed in the adaptive ray-launching process. Ground multipath is a special case of multipath since the ground is usually flat and acts like a mirror in a GO approximation with certain reflection loss for the electric fields. For the scenario with a ground plane, it would be computationally very inefficient to shoot electromagnetic rays to all portions of the ground. Alternatively, it is only required to shoot electromagnetic rays to the ground if the reflected electromagnetic ray may hit a target. The angular ray density for an electromagnetic ray launched towards the ground can be determined by the length of the electromagnetic ray to the hit point on the target after ground reflection, as opposed to the length of the electromagnetic ray to the hit point on the ground, as the target is the object of interest in the simulation. Other multipath effects, such as horizontal multipath from large vehicles or guardrails, cannot be explicitly given, and the two-stage ray-launching process 500-1 may accurately simulate this effect.

FIG. 5-1 illustrates a flowchart of the adaptive ray-launching process 500-1. At step 502, target information and a field of view of a transmitter/receiver are received for the simulation by the ray launcher. The target information includes the geometric information of all the targets in the environment.

At step 504, the angular occupancy grids of the targets are determined, and sparse electromagnetic rays are shot to the occupied pixels of the angular occupancy grid. To determine the angular occupancy grid, a three-dimensional boundary for each target and each respective target image is determined, and the angular occupancy grids for the targets are calculated with respect to the transmitter/receiver. In one example, the resolution of the angular occupancy grids is 0.1 degree. The sparse electromagnetic rays are uniformly distributed when they are shot to the center of each pixel in the angular occupancy grids occupied by the targets and their images (e.g., based on image theory).

At step 506, ray tracing is performed by the ray tracer, and the distance that the sparse electromagnetic rays travel to reach the respective targets, up to the second bounce of each electromagnetic ray (e.g., electromagnetic energy), is calculated. Up to the second bounce means the distance excludes sparse rays with more than one multipath reflection. The ray-tracing process is applied to compute the length of each electromagnetic ray up to the second bounce (e.g., the traveled distance of the electromagnetic ray from the source to the second bouncing point, if a second bouncing point exists). That is, the length of each electromagnetic ray may include a first distance from the electromagnetic sensor to a first reflection point and a second distance from the first reflection point to a second reflection point.

At step 508, the angular ray densities for each pixel are determined based on the length of the sparse electromagnetic rays shot at step 504. By determining the angular ray densities for each pixel, the targets and the respective images having lower angular ray densities can be determined. The angular ray densities are calculated by dividing a desired spatial ray density by the length of the sparse electromagnetic rays.

At step 510, dense electromagnetic rays are launched. The dense electromagnetic rays are launched with different angular ray densities for different targets after considering multipath effects. The adaptive ray-launching process 500-1 also considers the propagation paths described with respect to FIG. 2-4. The adaptive ray-launching process 500-1 enables a higher fidelity for the electromagnetic simulation, resulting in more accuracy.

FIG. 5-2 illustrates an example implementation 500-2 of step 504 with respect to FIG. 5-1. A transceiver 512, utilizing the ray launcher, launches sparse electromagnetic rays with equal angular ray density towards targets 514. As illustrated in FIG. 5-2, a greater quantity of the sparse electromagnetic rays hit the closer targets 514-1 and 514-3 than hit the farther target 514-2. Additionally, some sparse electromagnetic rays are shot towards a boundary 516 in consideration of the images (not shown) of the targets 514. As illustrated in FIG. 5-2, the electromagnetic ray 518 does not hit a target. The electromagnetic ray 518 represents an electromagnetic ray that travels beyond the range of the transceiver 512 and can be disregarded.

FIG. 5-3 illustrates an example implementation 500-3 of step 506 with respect to FIG. 5-1. Multipaths are illustrated for some of the sparse electromagnetic rays. The lengths of the sparse electromagnetic rays are calculated up to the second bounce. For example, an electromagnetic ray 520 has two components. The length of these two components is added to find the total length of the electromagnetic ray 520.

FIG. 5-4 illustrates an example implementation 500-4 of step 508 with respect to FIG. 5-1. Angular ray densities for each of the electromagnetic rays 520, 522, and 524 are calculated based on a predefined spatial ray density (e.g., 0.01 m). If the two components of the electromagnetic ray 520 have lengths of $r_1$ and $r_2$ and the pre-defined ray density is denoted as $d_{req}$, then $$\rho = \frac{d_{req}}{r_1 + r_2} \quad (2)$$

where $\rho$=the angular ray density.

In the case of electromagnetic ray 524 with only one component, then the angular ray density can be calculated as $$\rho = \frac{d_{req}}{r_1} \quad (3)$$

where $r_1$ is the length of the one component of the electromagnetic ray 524.

The adaptive ray-launching process 500-1 considers that targets in the far-range (e.g., 514-2) can have lower angular ray densities than closer targets (e.g., targets 514-1 and 514-3). The adaptive ray-launching process 500-1 calculates the angular ray densities and launches dense electromagnetic rays based on the angular ray densities calculated with the lengths of the sparse electromagnetic rays. In this manner, the adaptive ray-launching process 500-1 enables the targets in the far-range to have similar resolution as the closer targets.

Figures 1, 6:
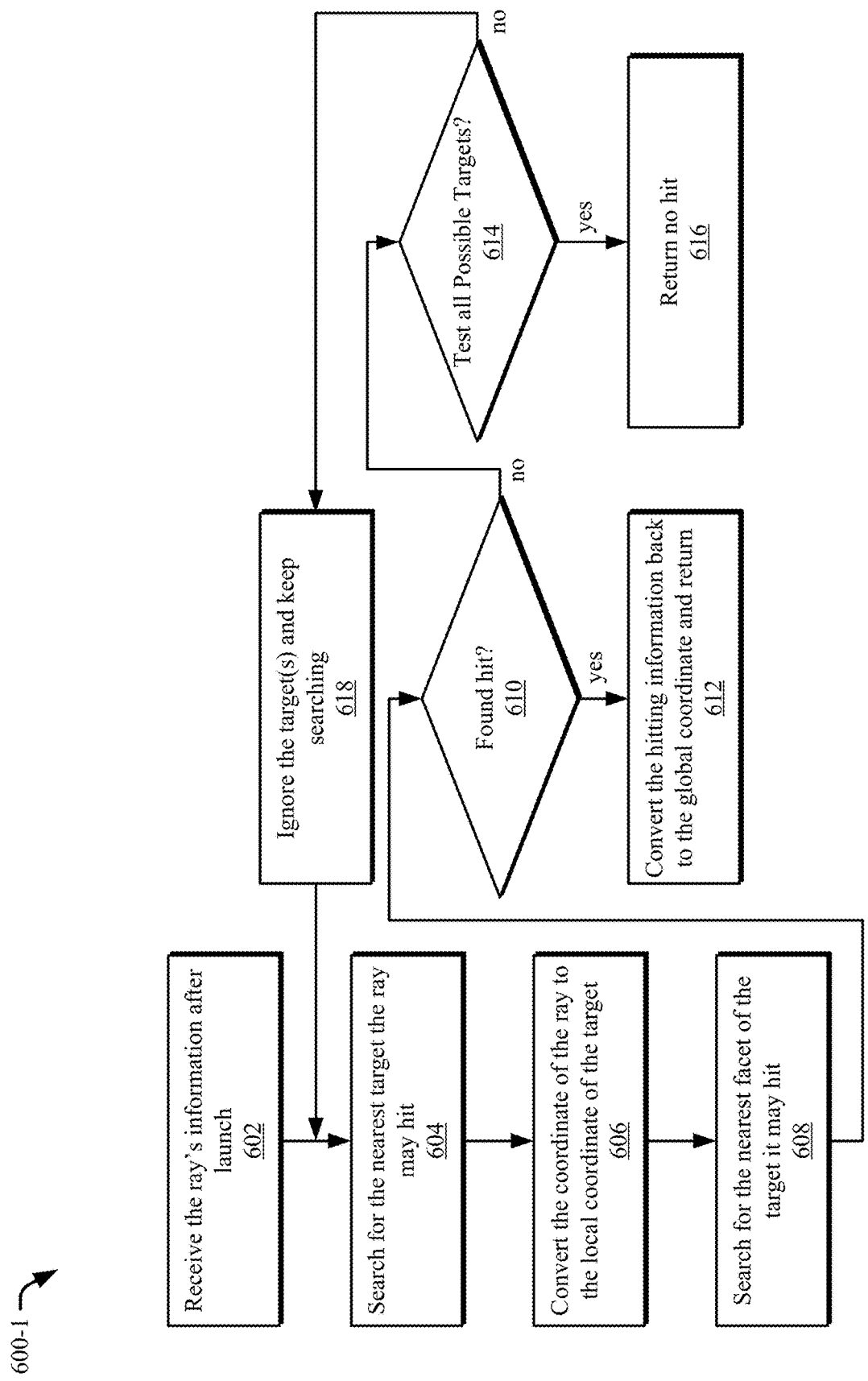
Figures 2, 6:
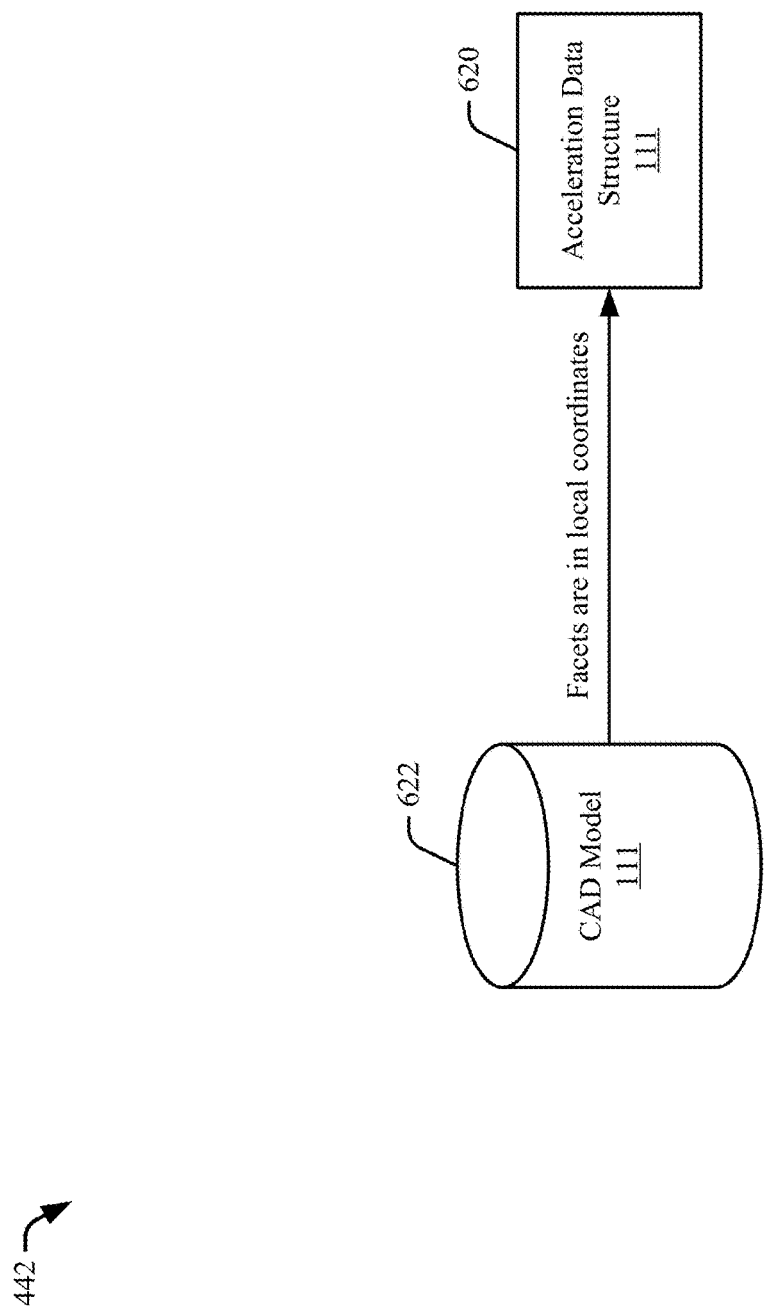

FIG. 6-1 illustrates a flowchart of a modified ray-tracing process 600-1 for accurate and efficient electromagnetic response for a sensor simulator. At step 602, a ray tracer receives information about an electromagnetic ray after launch. The information includes a starting point and a direction of travel of the electromagnetic ray relative to a global coordinate system of the simulated environment.

At step 604, the ray tracer searches for a nearest target that the electromagnetic ray may hit. The search is performed based on the global coordinates of the simulated environment. In one example, the search is performed across targets in a two-dimensional KD-tree. At step 604, the targets are considered rectangles that bound the targets.

At step 606, once the ray tracer finds a potential target that may be hit by the electromagnetic ray, the ray tracer converts the information of the electromagnetic ray to the local coordinates of the target. In one example, information about the target is stored in an acceleration data structure indicative of geometric profile of the target. The acceleration data structure may be pre-calculated and used for any target with the same geometric profile. Further, the pre-calculated acceleration data structure may be used for a duration of the simulation. The duration may include the entirety of the simulation or a portion of the simulation.

At step 608, the ray tracer searches for the nearest facet of the target it may hit. The facet information can be stored in the acceleration data structure. The ray tracer compares the information of the electromagnetic ray that is in the local coordinates of the target to the facet information of the target.

At step 610, if after comparing the facet information with the electromagnetic ray, the ray tracer determines that a facet of the target is hit by the electromagnetic ray, then the ray tracer proceeds to step 612. If the electromagnetic ray does not hit a facet of the target, then the ray tracer proceeds to step 614.

At step 612, the information of the reflected electromagnetic rays is converted back to the global coordinates of the simulated environment. The information of the reflected ray includes the hit point (e.g., a starting point of the reflected electromagnetic ray) of the electromagnetic ray on the facet of the target and the direction of the reflection. The information of the reflected ray is output to the EM module. The process of determining whether a facet of the target is hit by the electromagnetic ray and the direction of the reflected electromagnetic ray is described in more detail after the description of the steps.

At step 614, the ray tracer determines if all the potential targets have been tested. If there are no targets left to be tested, then the ray tracer proceeds to step 616. If there are more potential targets to be tested, then the ray tracer proceeds to step 618.

At step 616, if the electromagnetic ray did not hit any targets, then the ray tracer outputs that the electromagnetic ray did not hit a target. This electromagnetic ray may be disregarded.

At step 618, the potential target that was being evaluated is ignored and the ray tracer starts the process over at step 604. These steps enable that only reflected electromagnetic rays are included in the output of the electromagnetic simulator.

The process of determining whether a facet of the target is hit by the electromagnetic ray depends on the following principles. The wave propagation at mm-wave frequencies is approximated by GO. The principle is relatively simple: a ray propagates in a straight line, and if it hits a reflective surface, it gets reflected and propagates in the specular direction:

$$\hat{k}_r = \hat{k}_i - 2(\hat{k}_i \cdot \hat{n})\hat{n} \quad (4)$$

where $\hat{k}_i$ is the incident direction, n is the normal vector on the surface, and $\hat{k}_r$ denotes the direction of the reflection.

In the SBR simulation, after the ray tracing process, every face area the ray tube hits will generate an equivalent surface current based on the boundary conditions, and the equivalent surface current will radiate scattered fields back to the receiver. Depending on the scene, many paths for the scattered fields to arrive at the receiver may exist.

According to the Huygens principle, the scattered fields from current sources are given by:

$$\vec{E}_s(\vec{r}) = \int\int_{s'} \left[ i\omega\mu_0 \vec{J}_s(\vec{r}')\left\{\left(\frac{3}{k^2R^2} - \frac{3i}{kR} - 1\right)\hat{R}\hat{R} + \left(1 + \frac{i}{kR} - \frac{1}{k^2R^2}\right)\overline{\overline{I}}\right\} - \left(ik - \frac{1}{R}\right)(\hat{R} \times \vec{J}_m(\vec{r}')) \cdot \overline{\overline{I}} \right] \frac{e^{ikR}}{4\pi R} ds' \quad (5)$$

where $\vec{J}_s(\vec{r}')$ and $\vec{J}_m(\vec{r}')$ denote the electric and magnetic surface current, k is the wavenumber in free space, $\overline{\overline{I}}$ is the dyadic idemfactor and R is the length of the vector from source point $\vec{r}'$ to observation point $\vec{r}$:

$$\hat{R} = \frac{\vec{r} - \vec{r}'}{|\vec{r} - \vec{r}'|}, \quad R = |\vec{r} - \vec{r}'|. \quad (6)$$

If the distance R is much larger than the wavelength, (i.e., kR>>1), the far-range approximation can be applied to (1):

$$\vec{E}_s(\vec{r}) = ik(\overline{\overline{I}} - \hat{R}\hat{R}) \cdot \int\int_{s'} [Z_0 \vec{J}_s(\vec{r}') - (\hat{R} \times \vec{J}_m(\vec{r}'))] \frac{e^{ikR}}{4\pi R} ds' \quad (7)$$

The surface currents $\vec{J}_s(\vec{r}')$ and $\vec{J}_m(\vec{r}')$ are defined as:

$$\vec{J}_s = \quad (8)$$

$$\hat{n} \times (\vec{H}_i + \vec{H}_r) = \frac{1}{Z_0}[Z_0 \vec{H}_i \cdot \hat{t}(1 + R_{TM})(\hat{n} \times \hat{t}) + \vec{E}_i \cdot \hat{t}(\hat{n} \cdot \hat{k}_i)(R_{TE} - 1)\hat{t}]e^{i\vec{k}_i \cdot \vec{r}},$$

$$\vec{J}_m = \quad (9)$$

$$-\hat{n} \times (\vec{E}_i + \vec{E}_r) = [Z_0 \vec{H}_i \cdot \hat{t}(\hat{n} \cdot \hat{k}_i)(R_{TM} - 1)\hat{t} - \vec{E}_i \cdot \hat{t}(1 + R_{TE})(\hat{n} \times \hat{t})]e^{i\vec{k}_i \cdot \vec{r}}.$$

where $\vec{E}_i$ and $\vec{H}_i$ are the incident electric and magnetic fields, respectively, $\hat{t}$ is the tangential vector on the surface, defined as $\hat{t}=(\vec{k}_i\times\hat{n})/|\vec{k}_i\times\hat{n}|$, $\vec{k}_i$ is the incident direction unit vector, $\hat{n}$ is the normal vector of the surface, $R_{TM}$ and $R_{TE}$ are the Fresnel reflection coefficients of the surface for Transverse Magnetic(TM) and Transverse Electric (TE) cases. The Fresnel reflection coefficients $R_{TM}$ and $R_{TE}$ are given by, $$R_{TE}=(\eta_2 \cos\theta_1-\eta_1 \cos\theta_2)/(\eta_2 \cos\theta_1+\eta_1 \cos\theta_2) \quad (10)$$

$$R_{TM}=(\eta_1 \cos\theta_1-\eta_2 \cos\theta_2)/(\eta_1 \cos\theta_1+\eta_2 \cos\theta_2) \quad (11)$$

where $\eta_1$ and $\eta_2$ are the characteristic impedance of air and target, $\theta_1$ and $\theta_2$ are the incident and refraction angle with respect to the surface of targets.

For metal materials $\varepsilon_2$ is very large, $\eta_2$ becomes negligible and $R_{TE}\approx-1$, $R_{TE}\approx1$. Then $\vec{j}_m\approx 0$, and $\vec{j}_s\approx 2\hat{n}\times\vec{H}_i$. The equation (7) can be further simplified as:

$$\vec{E}_s(\vec{r}) = ik(\vec{\vec{I}} - \hat{R}\hat{R})\cdot\iint_{s'}[Z_0\vec{J}_s(\vec{r}')]\frac{e^{ik_0 R}}{4\pi R}ds' \quad (12)$$

If the radar is in the far-range of the polygon area s', large element PO can be applied. The surface currents can then be rewritten as:

$$\vec{J}_s(\vec{r}') = \vec{J}_{sm}e^{i\vec{k}_i\cdot(\vec{r}'-\vec{r}_0)} \quad (13)$$

$$\vec{M}_s(\vec{r}') = \vec{M}_{sm}e^{i\vec{k}_i\cdot(\vec{r}'-\vec{r}_0)} \quad (14)$$

where $\vec{r}_0$ denotes the position of transmitter. The scattered fields then become:

$$\vec{E}_s = \frac{ik_0 e^{i(\vec{k}_s-\vec{k}_i)\cdot\vec{r}}}{4\pi R}(\vec{\vec{I}}-\hat{k}_s\hat{k}_s)[Z_0\vec{J}_{sm}-\hat{k}_{sn}\times\vec{M}_{sm}]\iint e^{i(\vec{k}_i-\vec{k}_s)\cdot\vec{r}'}ds' = \quad (15)$$

$$\frac{k_0 e^{i(\vec{k}_s-\vec{k}_i)\cdot(\vec{r}-\vec{O}')}}{4\pi R k_\alpha}(\vec{\vec{I}}-\hat{k}_s\hat{k}_s)[Z_0\vec{J}_{sm}-\hat{k}_{sn}\times\vec{M}_{sm}]\sum_1^l \vec{e}_i\cdot$$

$$\hat{t}\frac{e^{ik_\alpha(\vec{v}_i+\vec{v}_{i+1})\cdot\hat{\alpha}/2}\sin\left(\frac{1}{2}k_\alpha\vec{e}_i\cdot\hat{\alpha}\right)}{\frac{1}{2}k_\alpha\vec{e}_i\cdot\hat{\alpha}},$$

where $\vec{k}=\vec{k}_i-\vec{k}_s=\vec{k}_n+\vec{k}_\alpha$, $\vec{k}_n$ is the component in the $\hat{n}$ direction, $\vec{k}_n=(\vec{k}\cdot\hat{n})\hat{n}$, and $\vec{k}_\alpha$ is the component on the surface of the facet, $\vec{k}_\alpha=k_\alpha\hat{\alpha}$. l denotes the number of edges for the polygon. $\hat{t}$ is a tangential unit vector on the surface perpendicular to $\vec{k}$. $\vec{e}_i$ denotes the edge vector of the polygon:

$$\vec{e}_i = \vec{v}_{i+1} - \vec{v}_i (i=1,2,3,\ldots,\vec{v}_{l+1}=\vec{v}_1) \quad (16)$$

In the SBR rays approximation, the ray tube has a square shape and the integration area on the surface of a target is the projection of the ray, which is assumed to be a parallelogram. The summation term in (15) for a parallelogram can be simplified as:

(17)

$$\sum_1^4 \vec{e}_i\cdot\hat{t}\frac{e^{ik_\alpha(\vec{v}_i+\vec{v}_{i+1})\cdot\hat{\alpha}/2}\sin\left(\frac{1}{2}k_\alpha\vec{e}_i\cdot\hat{\alpha}\right)}{\frac{1}{2}k_\alpha\vec{e}_i\cdot\hat{\alpha}} =$$

$$\begin{cases} -2i(\vec{e}_1\cdot\hat{t})\sin\frac{1}{2}k_\alpha\vec{e}_2\cdot\hat{\alpha}, & \vec{e}_1\cdot\hat{\alpha}=0 \\ 2i(\vec{e}_2\cdot\hat{t})\sin\frac{1}{2}k_\alpha\vec{e}_1\cdot\hat{\alpha}, & \vec{e}_2\cdot\hat{\alpha}=0 \\ \frac{4i}{k_\alpha}\left[\frac{\vec{e}_2\cdot\hat{t}}{\vec{e}_2\cdot\hat{\alpha}} - \frac{\vec{e}_1\cdot\hat{t}}{\vec{e}_1\cdot\hat{\alpha}}\right]\left(\sin\left(\frac{1}{2}k_\alpha\vec{e}_1\cdot\hat{\alpha}\right)\sin\left(\frac{1}{2}k_\alpha\vec{e}_2\cdot\hat{\alpha}\right)\right), \\ \vec{e}_2\cdot\hat{\alpha}\neq 0 \text{ and } \vec{e}_1\cdot\hat{\alpha}\neq 0 \end{cases}$$

Then the scattered fields of the currents induced by a ray tube to a scattering direction with different polarizations can be efficiently calculated.

FIG. 6-2 illustrates an example of a pre-calculated acceleration data structure 620 for a target in an electromagnetic simulator that generates accurate and efficient electromagnetic response for a sensor simulator. The geometry of many of the targets in an electromagnetic simulation does not change throughout the simulation. Only information pertaining to the position or orientation may change. This enables these targets to use a pre-calculated acceleration data structure. For these targets, the pre-calculated acceleration data structure 620 can be used in every frame of the simulation. Additionally, any targets with the same CAD model can use the pre-calculated data structure 620. Local coordinates of a CAD model 622 of the target are used to generate the pre-calculated acceleration data structure 620. Material properties of the target may be loaded to generate a polarimetric reflection coefficient lookup table that can be used in subsequent steps for electromagnetic calculations. If the material is penetrable with a given thickness (represented by a threshold), then the transmission coefficients of the target can, likewise, be computed. The pre-calculated acceleration data structure 620 enables a simulation to be efficient and conserve computational resources, such as processing and memory.

Figure 7:
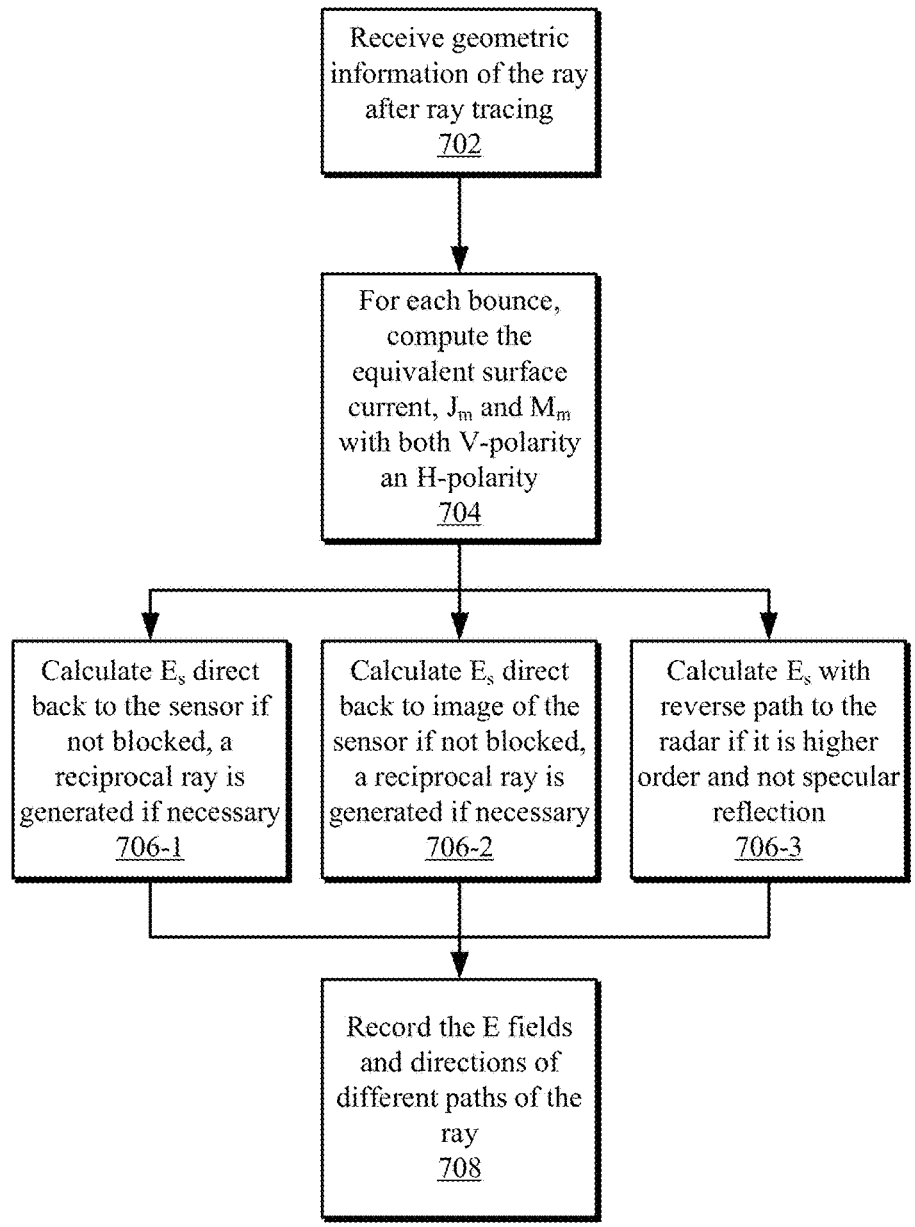
FIG. 7 illustrates a flowchart for calculating accurate and efficient electromagnetic response for a sensor simulator, in accordance with techniques of this disclosure.

FIG. 7 illustrates a flowchart 700 for calculating accurate and efficient electromagnetic response for a sensor simulator. At step 702, an EM module, receives geometric information of an electromagnetic ray after ray tracing is performed. The EM module can receive the information from a ray tracer.

At step 704, the EM module computes, for each bounce of the electromagnetic ray, the equivalent surface currents, $J_m$ and $M_m$. $J_m$ and $M_m$ include the V-polarization and H-polarization cases. The surface currents are based on the incident fields with different polarizations.

At step 706, the EM module examines up to five scattering paths back to the transceiver (e.g., the scattering paths 244, 246, 250, 252, and 254 in FIG. 2-4). If the scattering path is required, the EM module computes the scattered field for different polarizations of each required path. At step 706-1, the EM module calculates paths such as paths 244 and 252. At step 706-2, the EM module calculates paths such as paths 246 and 254. At step 706-3, the EM module calculates paths such as path 250.

At step 708, the EM module records the scattered E fields and their directions of departure and arrival for each electromagnetic ray. The EM module may then output the records to a radar simulator.

Figures 1, 8:
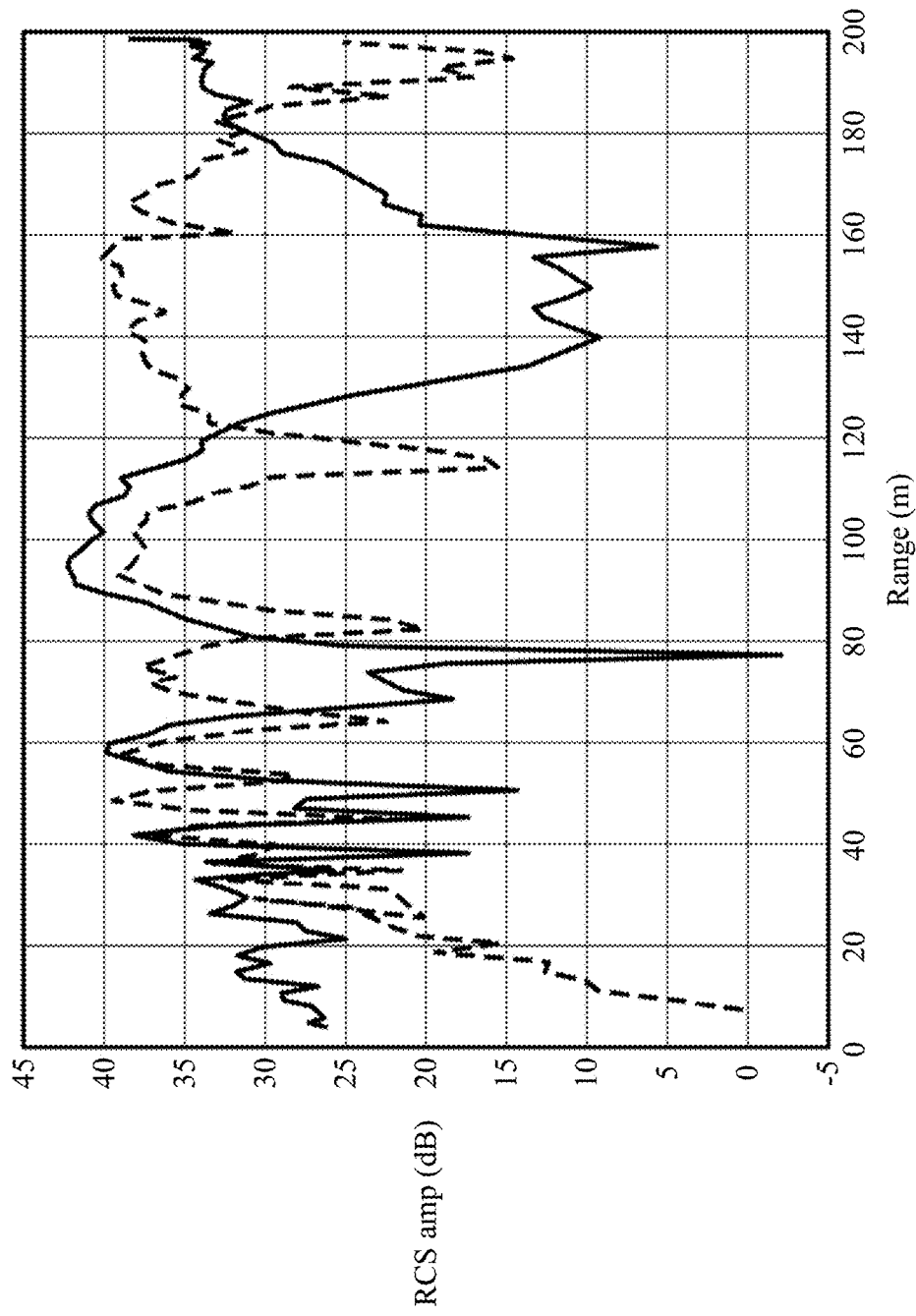
Figures 2, 8:
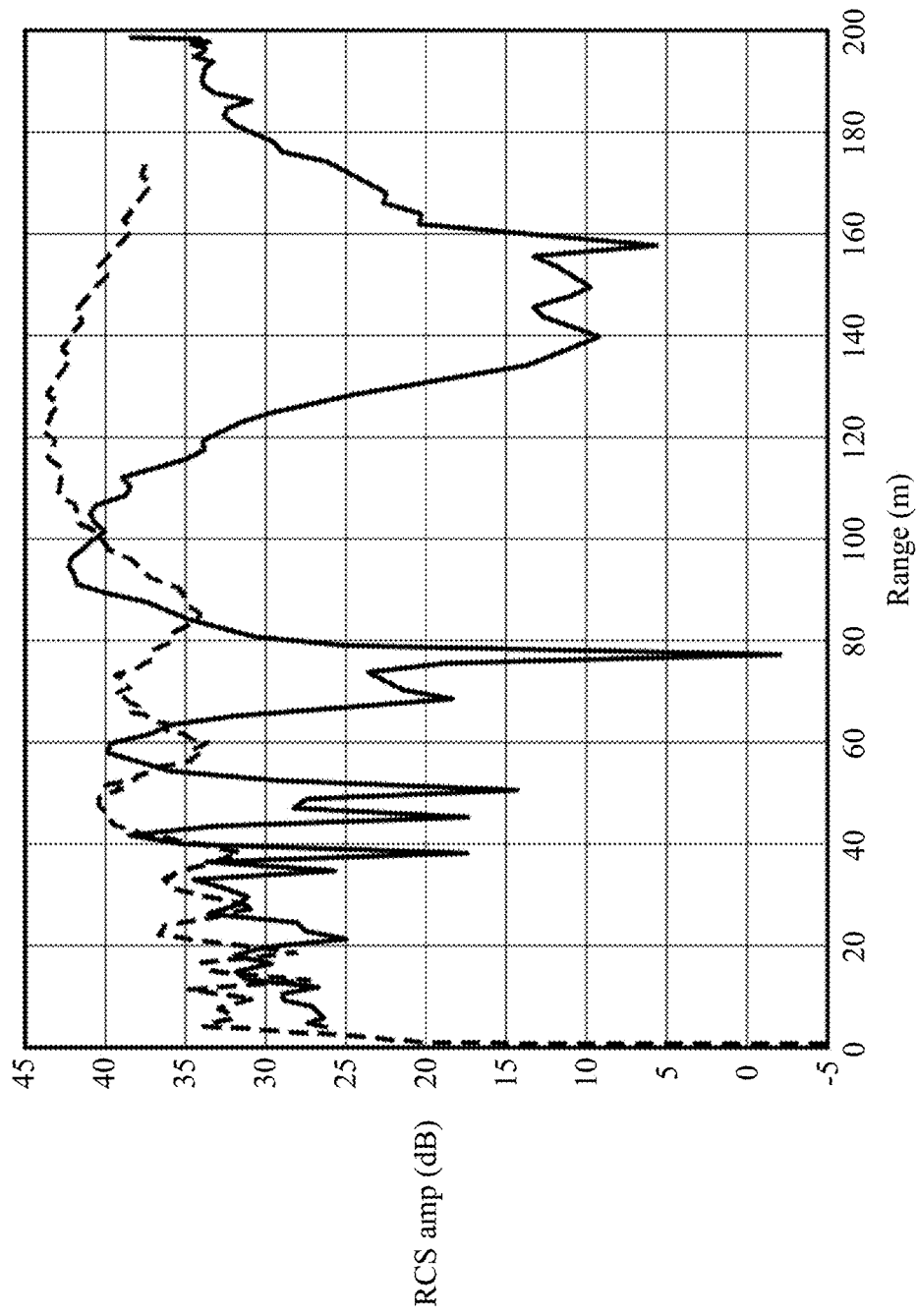
Figures 3, 8:
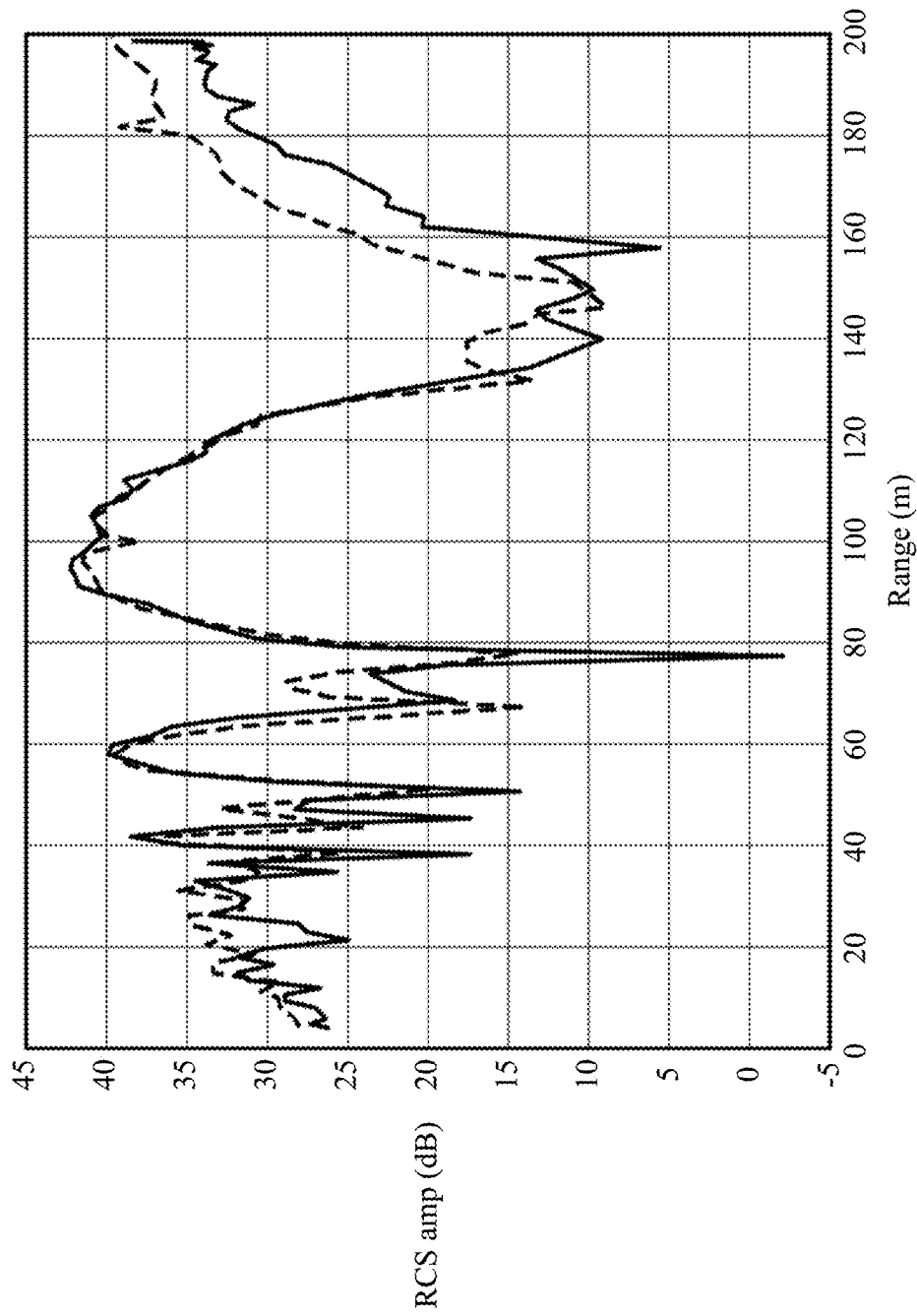

FIGS. 8-1 through 8-3 illustrate example results of an electromagnetic simulator generating accurate and efficient electromagnetic response for a sensor simulator compared to other commercial simulators. To demonstrate simulation accuracy considering vertical multipath, a radar cross section of a corner reflector placed approximately 0.52 meters above a road is simulated (e.g., thin line in each graph) and compared to measurements from a real radar (e.g., thick line in each graph). All the simulations used the same high-fidelity radar simulator. FIGS. 8-1 and 8-2 are graphs representing different example results of commercially available electromagnetic simulators. FIG. 8-3 is a graph that represents results of using an electromagnetic simulator generating accurate and efficient electromagnetic response for a sensor simulator, in accordance with the described techniques. In contrast to the results illustrated FIGS. 8-1 and 8-2, the results shown in FIG. 8-3 illustrate very high correlation between the simulated radar and the real radar.

Example Methods

Figure 9:
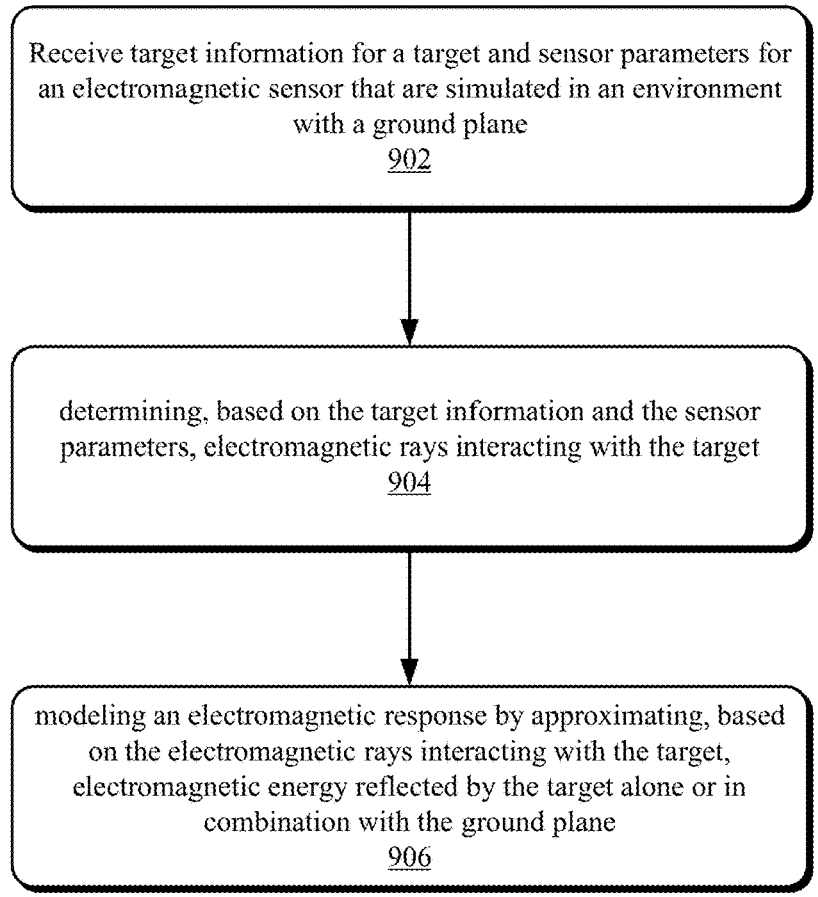
FIG. 9 illustrates an example method for accurate and efficient electromagnetic response for a sensor simulator, in accordance with techniques of this disclosure.

FIG. 9 illustrates an example method 900 for accurate and efficient electromagnetic response for a sensor simulator. The operations (or steps) 902 through 906 are performed but are not necessarily limited to the order or combinations in which the operations are shown herein. Further, any of one or more of the operations may be repeated, combined, or reorganized to provide other operations.

At step 902, target information for a target and sensor parameters for an electromagnetic sensor that are simulated in an environment with a ground plane are received by an electromagnetic simulator. The target information can include position, orientation, and speed of the target. The sensor parameters can include position, orientation, field of view, and operating frequency of the sensor.

At step 904, electromagnetic rays interacting with the target are determined based on the target information and the sensor parameters. The electromagnetic rays may be determined by a modified SBR method using electromagnetic image theory that considers both forward and backward propagation paths. Using the modified SBR method and the electromagnetic image theory may enable less complexity and more accuracy when computing the electromagnetic rays.

At step 906, an electromagnetic response is modeled by approximating, using the electromagnetic rays interacting with the target, electromagnetic energy reflected by the target alone or in combination with the ground plane. The electromagnetic response may be approximated by an EM module that calculates the electromagnetic response based on the electromagnetic rays interacting with the target. The electromagnetic response can be used by a sensor simulator to accurately represent electromagnetic energy that a sensor detects in the real world.

Figure 10:
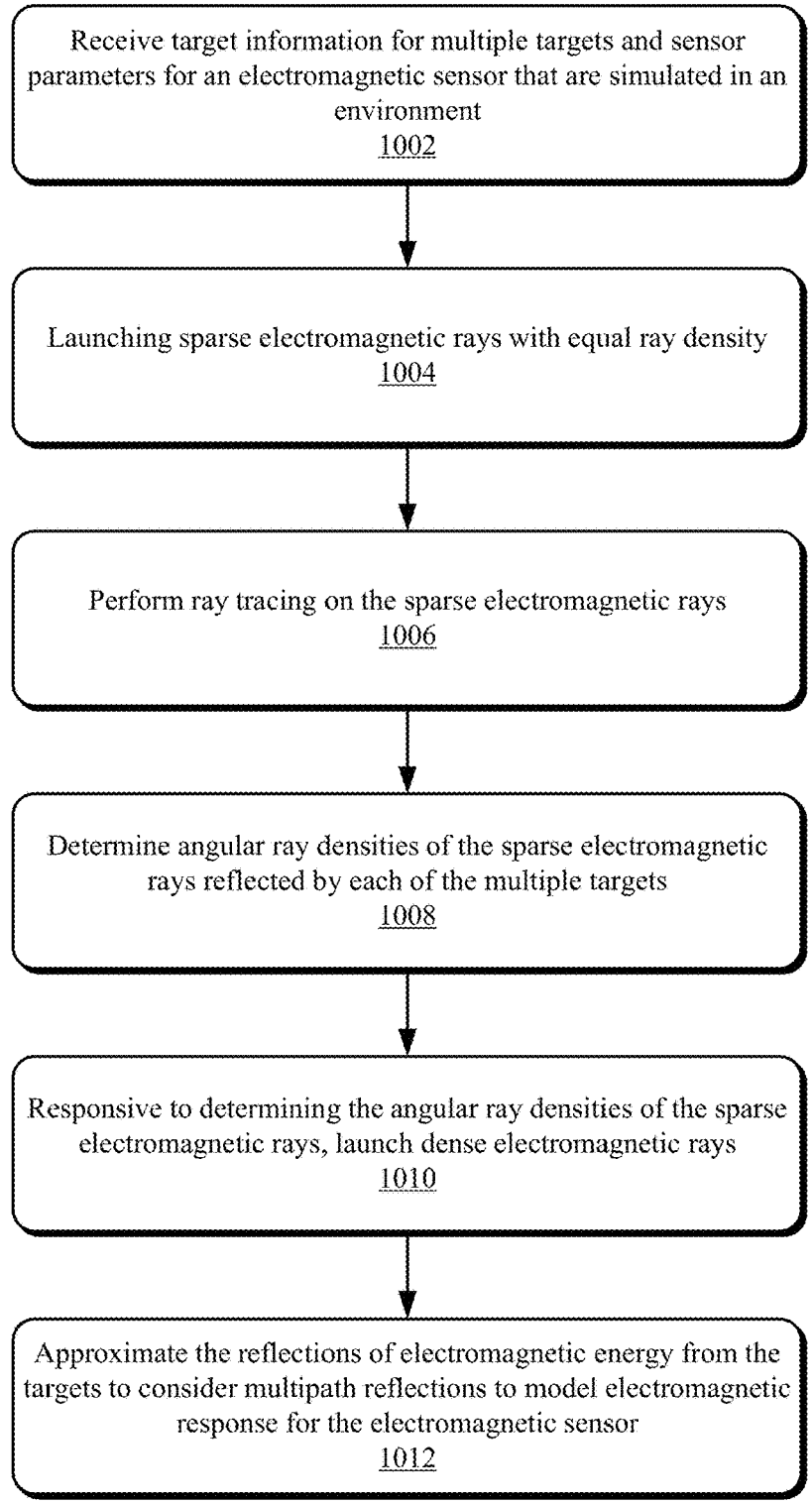
FIG. 10 illustrates another example method for accurate and efficient electromagnetic response for a sensor simulator, in accordance with techniques of this disclosure.

FIG. 10 illustrates another example method 1000 for accurate and efficient electromagnetic response for a sensor simulator. The operations (or steps) 1002 through 1012 are performed but are not necessarily limited to the order or combinations in which the operations are shown herein. Further, any of one or more of the operations may be repeated, combined, or reorganized to provide other operations.

At step 1002, target information for multiple object and sensor parameters for an electromagnetic sensor that are simulated in an environment are received by an electromagnetic simulator. The target information can include position, orientation, and speed of the target. The sensor parameters can include position, orientation, field of view, and operating frequency of the sensor.

At step 1004, sparse electromagnetic rays are launched in the electromagnetic simulator. The rays may be launched by a ray launcher using an adaptive ray-launching process and launched across an azimuth of the electromagnetic sensor. The adaptive ray-launching process shoots uniformly distributed sparse rays towards targets in a simulated environment by finding an angular occupancy grid of the multiple targets. The angular occupancy grid may be found by using image theory to determine image of the multiple targets about a ground plane. In this case, the ground plane may be based on electromagnetic image theory and is defined by surfaces contributing to multipath reflections of the sparse electromagnetic rays as they travel to the multiple targets. A three-dimensional boundary for each target and each respective target image can then be determined. The sparse rays are launched to the occupied pixels of the occupancy grid.

At step 1006, ray tracing is performed on the sparse electromagnetic rays. The sparse rays may hit and bounce between targets up to a second bounce.

At step 1008, angular ray densities of the sparse electromagnetic rays reflected by each of the multiple targets are determined. The angular ray densities may be computed by finding the length of each sparse ray up to the second bounce for each occupied pixel in the occupancy grid. The length of each sparse ray is the distance that each sparse ray travels to reach each respective target. A desired spatial ray density on the surface of a target or image is divided by the lengths of the electromagnetic rays that hit an occupied pixel that represents a respective target or image to calculate the angular ray densities. In one example, the desired spatial ray density may be approximately 0.01 meter. Other desired spatial ray densities may, likewise, be used.

At step 1010, dense electromagnetic rays are launched toward the multiple targets. The dense rays enable targets in the far-range to have similar fidelity as closer targets.

At step 1012, scattering of electromagnetic energy of the targets is approximated by examining the dense rays. The reflections of the electromagnetic energy can then be approximated by generating the equivalent surface currents of each of the dense electromagnetic rays on at least one target based on the incident fields. The multiple possible scattering paths of the dense electromagnetic rays can be examined, and responsive to any of the scattering paths being required scattering paths, polarimetric scattered fields of the dense electromagnetic rays for different polarizations are computed. The polarimetric scattered fields and a direction of departure and arrival for the required scattering paths are recorded (e.g., based on a direction of departure and arrival) for the approximation. Additionally, a propagated distance and time of flight (e.g., from a transmitter to a receiver) for each respective electromagnetic ray is recorded. The approximation includes multipath reflections that emulate real world electromagnetic energy. The approximations are used to model electromagnetic response for the electromagnetic sensor. By enabling targets in the far-range to have similar fidelity as any closer targets, the electromagnetic response being modeled may accurately reflect real world electromagnetic energy detected by the sensor.

Figure 11:
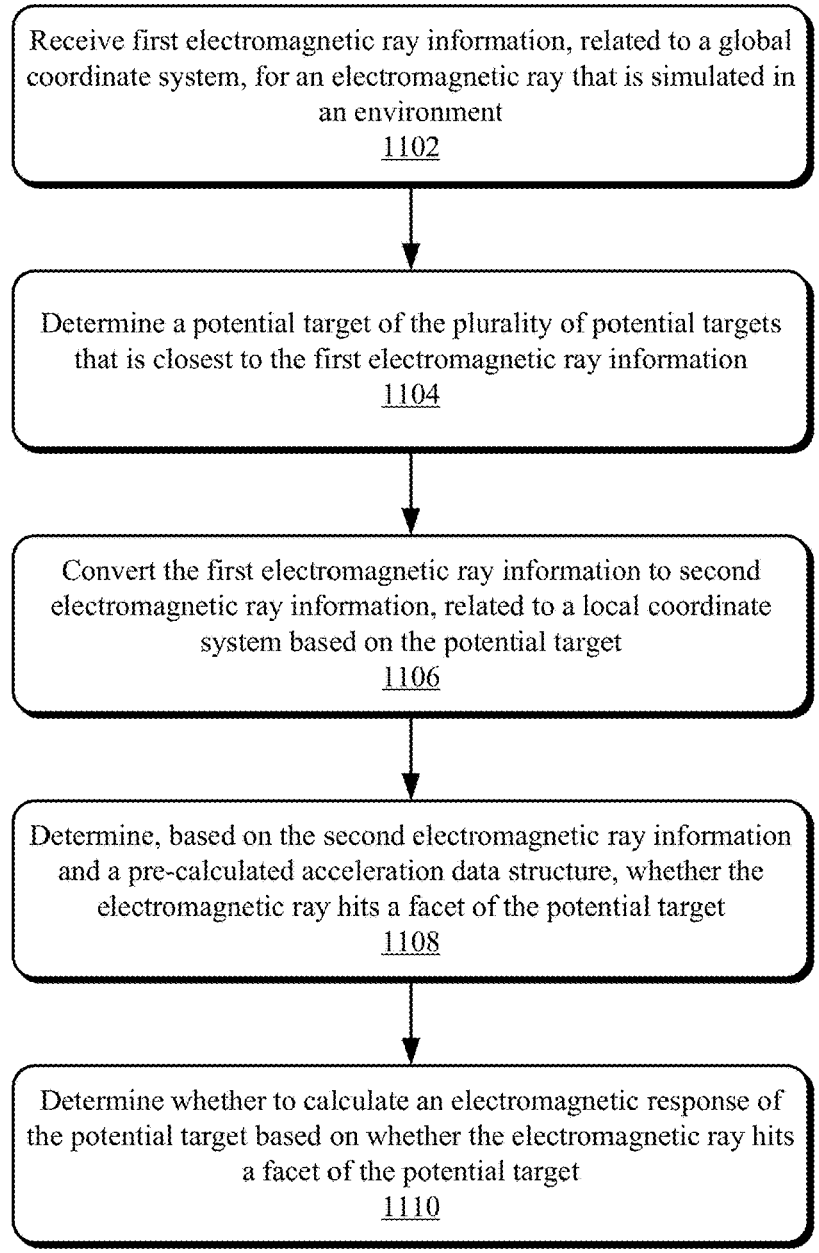
FIG. 11 illustrates another example method for accurate and efficient electromagnetic response for a sensor simulator, in accordance with techniques of this disclosure.

FIG. 11 illustrates another example method 1100 for accurate and efficient electromagnetic response for a sensor simulator. The operations (or steps) 1102 through 1110 are performed but are not necessarily limited to the order or combinations in which the operations are shown herein. Further, any of one or more of the operations may be repeated, combined, or reorganized to provide other operations.

At step 1102, first electromagnetic ray information is received for an electromagnetic ray that is simulated in an environment. The first electromagnetic ray information can include a starting point and direction for the ray and is relative to a global coordinate system of the environment. The first electromagnetic ray information may be stored and received by a ray tracer.

At step 1104, a potential target that is closest to the electromagnetic ray is determined by examining the first electromagnetic ray information. The proximity of the potential target to the electromagnetic ray is determined by the ray tracer in the global coordinate system using a pre-calculated acceleration data structure containing data about the potential target. The acceleration data structure can be populated by geometric information derived from a CAD model of the potential target. Potential targets with the same CAD model (e.g., single geometric profile) may utilize similar acceleration data structures, and if the geometries (e.g., a constant geometric profile that is precalculated) of the potential targets remain static throughout an electromagnetic sensor simulation, the acceleration data structure of the respective potential target may remain the same for every frame of the simulation. That is, the acceleration data structure may not be recalculated for every frame of the simulation. Further, polarimetric reflection coefficients for each of the potential targets from different incident angles can be determined and stored in a polarimetric reflection coefficient lookup table based on the material of each target. Additionally, for each target being penetrable above a threshold, transmission coefficients can be determined.

At step 1106, the first electromagnetic ray information is converted to second electromagnetic ray information. The second electromagnetic ray information is relative to a local coordinate system of the potential target.

At step 1108, whether the electromagnetic ray (e.g., a subset of the electromagnetic rays) hits a facet of the potential target is determined by examining the second electromagnetic ray information. The determination is made using a ray-tracing algorithm with the pre-calculated reusable acceleration data structure of the potential target. If the electromagnetic ray does not hit a facet of the potential target, then the steps 1104 to 1108 are repeated for the next-closest potential target. These steps are repeated until a hit on a facet of a potential target is determined. If no potential target has a facet that has been hit, the ray tracer determines that the electromagnetic ray did not hit a target. If a hit is determined, then third electromagnetic ray information is generated for the reflected ray. The third electromagnetic information may include the bounce point (e.g., starting point of the reflected ray) and the direction of the reflected ray. The third electromagnetic information is in the local coordinate system in relation to the potential target.

At step 1110, whether to calculate an electromagnetic response of the potential target is determined. If a facet of a potential target has been hit, then the electromagnetic response of the target is calculated. If a facet of a potential target has not been hit, the no electromagnetic response is calculated. If the facet of the potential target has been hit, equivalent surface currents of the reflected electromagnetic ray, based on and induced by the incident fields with different polarizations, can be generated. The scattered fields with up to five different paths from the equivalent surface currents back to the radar will be calculated with a simplified large element PO formulation. The scattered fields are calculated for different combinations of the polarization of the incident and scattered wave. The scattered fields information is stored in the electromagnetic ray. The third electromagnetic information can be converted to fourth electromagnetic information that is relative to the global coordinate system of the environment.

The fourth electromagnetic information then can be considered as a new first electromagnetic information, and steps 1102 to 1110 can be repeated with many iterations until the stop condition is reached (all rays hitting no targets or reaching the maximum number of iterations). That is, the fourth electromagnetic information can be used for a next potential target instead of the first electromagnetic ray information. In this manner, efficient ray tracing may be performed without making unnecessary calculations. Finally, the electromagnetic rays with similar properties (angle of departure/arrival, time of flight and Doppler shift) are combined, and the total electromagnetic responses of the potential target are represented by the plurality of the clustered electromagnetic rays. The calculated electromagnetic responses may then be recorded and used as an electromagnetic model for input to an execution of an electromagnetic sensor simulation of the environment.

Additional Examples

Example 1: A method comprising: receiving target information for a target and sensor parameters for an electromagnetic sensor that are simulated in an environment with a ground plane; determining, based on the target information and the sensor parameters, electromagnetic rays interacting with the target, the electromagnetic rays having forward propagation paths to the target and backward propagation paths from the target; and modeling an electromagnetic response by approximating, based on determining the electromagnetic rays interacting with the target, electromagnetic energy reflected by the target alone or in combination with the ground plane.

Example 2: The method of example 1, wherein determining the electromagnetic rays interacting with the target comprises: determining a target image for the target that mirrors the target about the ground plane; determining an electromagnetic sensor image that mirrors the electromagnetic sensor about the ground plane; launching initial electromagnetic rays from the electromagnetic sensor at the target and the target image, the initial electromagnetic rays having the same spatial ray density relative to the target and the target image; performing ray tracing to determine reflected electromagnetic rays from the target and the target image; and evaluating, based on equivalent surface currents, scattered fields of the reflected electromagnetic rays received by the electromagnetic sensor and the electromagnetic sensor image.

Example 3: The method of any one of the preceding examples, wherein evaluating scattered fields of the reflected electromagnetic rays received by the electromagnetic sensor and the electromagnetic sensor image further comprises: responsive to a respective ray of the initial electromagnetic rays being reflected by the target or crossing the ground plane, calculating dielectric Fresnel reflection coefficients for the target and the ground plane; and multiplying the scattered fields and respective incident fields by the dielectric Fresnel reflection coefficients.

Example 4: The method of any one of the preceding examples, wherein evaluating the scattered fields of the reflected electromagnetic rays comprises: computing the incident fields of the electromagnetic rays on the target using geometrical optics; and computing the equivalent surface currents on the target and the scattered fields of the reflected electromagnetic rays using physical optics.

Example 5: The method of any one of the preceding examples, wherein image theory is used to model the electromagnetic response for the simulated target.

Example 6: The method of any one of the preceding examples, wherein a shooting and bouncing rays method is used to approximate the electromagnetic energy propagated to the target and reflected by the target.

Example 7: The method of any one of the preceding examples, wherein approximating the electromagnetic energy reflected by the target includes multipath reflections from the ground plane.

Example 8: The method of any one of the preceding examples, wherein approximating the electromagnetic energy reflected by the target excludes reflections determined to be occluded by physical characteristics of the target.

Example 9: The method of any one of the preceding examples, wherein the target information comprises: position of the target; orientation of the target; and speed of the target.

Example 10: The method of any one of the preceding examples, wherein the parameters of the electromagnetic sensor comprise: position of the electromagnetic sensor; orientation of the electromagnetic sensor; field-of-view of the electromagnetic sensor; and operating frequency of the electromagnetic sensor.

Example 11: A system comprising: at least one processor configured to: receive target information for a target and sensor parameters for an electromagnetic sensor that are simulated in an environment with a ground plane; determine, based on the target information and the sensor parameters, electromagnetic rays interacting with the target, the electromagnetic rays having forward propagation paths to the target and backward propagation paths from the target; and model an electromagnetic response by approximating, based on determining the electromagnetic rays interacting with the target, electromagnetic energy reflected by the target alone or in combination with the ground plane.

Example 12: The system of any one of the preceding examples, wherein the at least one processor is configured to determine the electromagnetic rays associated with the target by at least: determining a target image for the target that mirrors the target about the ground plane; determining an electromagnetic sensor image that mirrors the electromagnetic sensor about the ground plane; launching initial electromagnetic rays from the electromagnetic sensor at the target and the target image, the initial electromagnetic rays having the same spatial ray density relative to the target and the target image; performing ray tracing to determine reflected electromagnetic rays from the target and the target image; and evaluating, based on equivalent surface currents, scattered fields of the reflected electromagnetic rays received by the electromagnetic sensor and the electromagnetic sensor image.

Example 13: The system of any one of the preceding examples, wherein the at least one processor is configured to evaluate the scattered fields of the reflected electromagnetic rays received by the electromagnetic sensor and the electromagnetic sensor image by at least: responsive to a respective ray of the initial electromagnetic rays being reflected by the target or crossing the ground plane, calculating dielectric Fresnel reflection coefficients for the target and the ground plane; multiplying the scattered fields and respective incident fields by the dielectric Fresnel reflection coefficients; computing, using ray tracing and geometrical optics, the incident fields of the electromagnetic rays on the target; and computing, using physical optics, the equivalent surface currents on the target and the scattered fields of the reflected electromagnetic rays.

Example 14: The system of any one of the preceding examples, wherein the at least one processor is configured to approximate the electromagnetic energy reflected by the target by including multipath reflections from the ground plane.

Example 15: The system of any one of the preceding examples, wherein the at least one processor is configured to approximate the electromagnetic energy reflected by the target by excluding reflections determined to be occluded by physical characteristics of the target.

Example 16: A computer-readable storage media comprising instructions that, when executed, cause at least one processor to: receive target information for a target and sensor parameters for an electromagnetic sensor that are simulated in an environment with a ground plane; determine, based on the target information and the sensor parameters, electromagnetic rays interacting with the target, the electromagnetic rays having forward propagation paths to the target and backward propagation paths from the target; and model an electromagnetic response by approximating, based on determining the electromagnetic rays interacting with the target, electromagnetic energy reflected by the target alone or in combination with the ground plane.

Example 17: The computer-readable storage media of any one of the preceding examples, wherein the instructions, when executed, further cause the at least one processor to determine the electromagnetic rays interacting with the target by at least: determining a target image for the target that mirrors the target about the ground plane; determining an electromagnetic sensor image that mirrors the electromagnetic sensor about the ground plane; launching initial electromagnetic rays from the electromagnetic sensor at the target and the target image, the initial electromagnetic rays having the same spatial ray density relative to the target and the target image; performing ray tracing to determine reflected electromagnetic rays from the target and the target image; and evaluating, based on equivalent surface currents, scattered fields of the reflected electromagnetic rays received by the electromagnetic sensor and the electromagnetic sensor image.

Example 18: The computer-readable storage media of any one of the preceding examples, wherein the instructions, when executed, further cause the at least one processor to evaluate the scattered fields of the reflected electromagnetic rays received by the electromagnetic sensor and the electromagnetic sensor image by at least: responsive to a respective ray of the initial electromagnetic rays being reflected by the target or crossing the ground plane, calculating dielectric Fresnel reflection coefficients for the target and the ground plane; multiplying the scattered fields and respective incident fields by the dielectric Fresnel reflection coefficients; computing, using ray tracing and geometrical optics, the incident fields of the electromagnetic rays on the target; and computing, using physical optics, the equivalent surface currents on the target and the scattered fields of the reflected electromagnetic rays.

Example 19: The computer-readable storage media of any one of the preceding examples, wherein the instructions, when executed, cause the at least one processor to approximate the electromagnetic energy reflected by the target by including multipath reflections from the ground plane.

Example 20: The computer-readable storage media of any one of the preceding examples, wherein the instructions, when executed, cause the at least one processor to approximate the electromagnetic energy reflected by the target by excluding reflections determined to be occluded by physical characteristics of the target.

Example 21: A method comprising: receiving sensor parameters, including a field of view, for an electromagnetic sensor and target information for one or more targets in the field of view that are simulated in an environment; launching sparse electromagnetic rays in the field of view; responsive to the sparse electromagnetic rays reflecting from the one or more targets, determining angular ray densities for dense electromagnetic rays to be launched towards the one or more targets; and approximating, based on launching the dense electromagnetic rays towards the one or more targets, reflections of electromagnetic energy from the targets to consider multipath reflections to model electromagnetic response for the electromagnetic sensor.

Example 22: The method of example 21, wherein the sparse rays are uniformly distributed.

Example 23: The method of any one of the preceding examples, wherein launching sparse electromagnetic rays in the field of view comprises: generating, based on the field of view of the electromagnetic sensor, an angular grid of pixels of the environment included in the field of view; determining, based on the target information, the pixels in the angular grid of pixels that are occupied by each of the one or more targets; and launching the sparse electromagnetic rays to the center of each pixel in the angular grid of pixels.

Example 24: The method of any one of the preceding examples, wherein a resolution of the angular grid of pixels is approximately 0.1 degree.

Example 25: The method of any one of the preceding examples, wherein determining the pixels in the angular grid of pixels that are occupied by each target of the one or more targets comprises: determining, based on image theory, images of the one or more targets about a ground plane, the ground plane defined by surfaces contributing to multipath reflections of electromagnetic radiation; and determining a three-dimensional boundary for each of the one or more targets and each of the images of the one or more targets, and wherein the one or more targets further comprise the images of the one or more targets.

Example 26: The method of any one of the preceding examples, wherein determining the angular ray densities for the dense electromagnetic rays comprises: calculating, based on a distance that the sparse electromagnetic rays travel to reach the respective targets, lengths of the sparse electromagnetic rays that are reflected from the one or more targets.

Example 27: The method of any one of the preceding examples, wherein the lengths of the sparse electromagnetic rays comprise: a first distance from the electromagnetic sensor to a first reflection point; and a second distance from the first reflection point to a second reflection point.

Example 28: The method of any one of the preceding examples, further comprising: dividing a desired spatial ray density by the lengths of the sparse electromagnetic rays that are reflected from the one or more targets.

Example 29: The method of any one of the preceding examples, wherein the desired spatial ray density is approximately 0.01 meter.

Example 30: The method of any one of the preceding examples, wherein the distance that the sparse rays travel to reach the respective targets excludes sparse electromagnetic rays with more than one multipath reflection.

Example 31: The method of any one of the preceding examples, wherein the multipath reflections considered comprise multiple possible scattering paths including: a first scattering path that includes a first forward propagation path to a multipath reflection, a first target reflection, and a first backward propagation path that returns directly back to the electromagnetic sensor; a second scattering path that includes the first forward propagation path to the multipath reflection, a second target reflection, and a second backward propagation path that returns to an image of the electromagnetic sensor; a third scattering path that includes the first forward propagation path to the multipath reflection, a third target reflection, and a third backward propagation path that travels along the first forward propagation path in the opposite direction of the first forward propagation path; a fourth scattering path that is an inverse path of the first scattering path; and a fifth scattering path that is an inverse path of the second scattering path.

Example 32: The method of any one of the preceding examples, wherein approximating the reflections of the electromagnetic energy comprises: receiving geometric information of the dense electromagnetic rays; computing, based on incident fields with different polarizations, equivalent surface currents on the respective target using physical optics; examining possible scattering paths of the dense electromagnetic rays; responsive to one or more of the possible scattering paths being required scattering paths, computing, based on the required scattering paths, polarimetric scattered fields of the dense electromagnetic rays for different polarizations using physical optics; and recording the polarimetric scattered fields, propagated distance and time of flight of each respective electromagnetic ray of the dense electromagnetic rays from a transmitter to a receiver of the electromagnetic sensor, a direction of departure, and a direction of arrival for each of the required scattering paths.

Example 33: A system comprising: at least one processor configured to: receive sensor parameters, including a field of view, for an electromagnetic sensor and target information for one or more targets in the field of view that are simulated in an environment; launch sparse electromagnetic rays in the field of view; responsive to the sparse electromagnetic rays reflecting from the one or more targets, determine angular ray densities for dense electromagnetic rays to be launched towards the one or more targets; and approximate, based on launching the dense electromagnetic rays towards the one or more targets, reflections of electromagnetic energy from the targets to consider multipath reflections to model electromagnetic response for the electromagnetic sensor.

Example 34: The system of any one of the preceding examples, wherein the at least one processor is configured to launch the sparse electromagnetic rays in the field of view by at least: generating, based on the field of view of the electromagnetic sensor, an angular grid of pixels of the environment included in the field of view; determining, based on the target information, the pixels in the angular grid of pixels that are occupied by each of the one or more targets; and launching the sparse electromagnetic rays to the center of each pixel in the angular grid of pixels.

Example 35: The system of any one of the preceding examples, wherein the at least one processor is configured to determine the pixels in the angular grid of pixels that are occupied by each target of the one or more targets by at least: determining, based on image theory, images of the one or more targets about a ground plane, the ground plane defined by surfaces contributing to multipath reflections of electromagnetic radiation; and determining a three-dimensional boundary for each of the one or more targets and each of the images of the one or more targets, and wherein the one or more targets further comprise the images of the one or more targets.

Example 36: The system of any one of the preceding examples, wherein the at least one processor is configured to determine the angular ray densities for the dense electromagnetic rays by at least: calculating, based on a distance that the sparse electromagnetic rays travel to reach the respective targets, lengths of the sparse electromagnetic rays that are reflected from the one or more targets.

Example 37: The system of any one of the preceding examples, wherein the lengths of the sparse electromagnetic rays comprise: a first distance from the electromagnetic sensor to a first reflection point; and a second distance from the first reflection point to a second reflection point.

Example 38: The system of any one of the preceding examples, wherein the at least one processor is further configured to determine the angular ray densities of the dense electromagnetic rays by: dividing a desired spatial ray density by the lengths of the sparse electromagnetic rays that are reflected from the one or more targets.

Example 39: A computer-readable storage medium comprising instructions that, when executed, cause at least one processor to: receive sensor parameters, including a field of view, for an electromagnetic sensor and target information for one or more targets in the field of view that are simulated in an environment; launch sparse electromagnetic rays in the field of view; responsive to the sparse electromagnetic rays reflecting from the one or more targets, determine angular ray densities for dense electromagnetic rays to be launched towards the one or more targets; and approximate, based on launching the dense electromagnetic rays towards the one or more targets, reflections of electromagnetic energy from the target to consider multipath reflections to model electromagnetic response for the electromagnetic sensor.

Example 40: The computer-readable storage medium of any one of the preceding examples, comprising instructions that, when executed, cause at least one processor to launch the sparse electromagnetic rays in the field of view by at least: generating, based on the field of view of the electromagnetic sensor, an angular grid of pixels of the environment included in the field of view; determining, based on the target information, the pixels in the angular grid of pixels that are occupied by each of the one or more targets; and launching the sparse electromagnetic rays to the center of each pixel in the angular grid of pixels.

Example 41: A method comprising: receiving first electromagnetic ray information for an electromagnetic ray that is simulated in an environment that includes a plurality of potential targets, the first electromagnetic ray information including a starting point and direction of the electromagnetic ray relative to a global coordinate system of the environment; determining a potential target of the plurality of potential targets that is closest to the first electromagnetic ray information; converting the first electromagnetic ray information to second electromagnetic ray information based on the potential target, the second electromagnetic ray information comprising the starting point and direction relative to a local coordinate system of the potential target; determining, based on the second electromagnetic ray information and a pre-calculated acceleration data structure indicative of a geometric profile of the potential target, whether the electromagnetic ray hits a facet of the potential target; and determining whether to calculate an electromagnetic response of the potential target based on whether the electromagnetic ray hits a facet of the potential target.

Example 42: The method of example 41, wherein the determining whether to calculate the electromagnetic response of the potential target comprises: determining to calculate the electromagnetic response of the potential target responsive to determining that the electromagnetic ray hit a facet of the potential target; and responsive to calculating the electromagnetic response, outputting the electromagnetic response to an electromagnetic model for input to an execution of an electromagnetic sensor simulation of the environment.

Example 43: The method of any one of the preceding examples, wherein the calculation of the electromagnetic response comprises: determining, based on the electromagnetic ray hitting the facet of the potential target, a reflected electromagnetic ray being reflected from the potential target; determining third electromagnetic ray information comprising a starting point and direction of the reflected electromagnetic ray relative to the local coordinate system of the potential target; and converting the third electromagnetic ray information to fourth electromagnetic ray information including the starting point and direction of the reflected electromagnetic ray relative to the global coordinate system of the environment, the fourth electromagnetic ray information being used for a next potential target instead of the first electromagnetic ray information received.

Example 44: The method of any one of the preceding examples, wherein the calculation of the electromagnetic response further comprises: generating, based on incident fields with different polarizations, equivalent surface currents induced by the incident fields based on the first electromagnetic information received; examining multiple possible scattering paths of the reflected electromagnetic ray; responsive to one or more of the multiple possible scattering paths being required scattering paths of the reflected electromagnetic ray, computing, based on the required scattering paths, scattered fields of the reflected electromagnetic ray for different polarizations; and recording the scattered fields, a direction of departure, and a direction of arrival for each of the required scattering paths of the reflected electromagnetic ray.

Example 45: The method of any one of the preceding examples, wherein the determining whether to calculate the electromagnetic response of the potential target comprises: determining to not calculate the electromagnetic response of the potential target responsive to determining that the electromagnetic ray does not hit a facet of the potential target; and the method further comprises: determining another potential target of the plurality of potential targets to the first electromagnetic ray information; converting the first electromagnetic ray information to other second electromagnetic ray information based on the other potential target, the other second electromagnetic ray information comprising the starting point and direction relative to a local coordinate system of the other potential target; determining, based on the other second electromagnetic ray information, whether the electromagnetic ray hits a facet of the other potential target; and determining whether to calculate the electromagnetic response associated with the electromagnetic ray based on the other potential target based on whether the electromagnetic ray hits a facet of the other potential target.

Example 46: The method of any one of the preceding examples, wherein the other potential target is a next-closest potential target.

Example 47: The method of any one of the preceding examples, wherein the pre-calculated acceleration data structure represents the potential target for a duration of an electromagnetic sensor simulation.

Example 48: The method of any one of the preceding examples, wherein a same pre-calculated acceleration data structure indicative of a single geometric profile is used to represent multiple potential targets having a same computer-aided design (CAD) model.

Example 49: The method of any one of the preceding examples, further comprising: determining, based on material properties of each of the one or more potential targets, polarimetric reflection coefficients for each of the one or more potential targets.

Example 50: The method of any one of the preceding examples, further comprising: generating a polarimetric reflection coefficient lookup table that includes the polarimetric reflection coefficients for each of the one or more potential targets.

Example 51: The method of any one of the preceding examples, further comprising: determining, based on the material of each of the one or more potential targets being penetrable above a threshold, transmission coefficients for each of the one or more potential targets.

Example 52: A system comprising: at least one processor configured to: receive first electromagnetic ray information for a set of electromagnetic rays that are simulated in an environment that includes a plurality of potential targets, the first electromagnetic ray information including a starting point and direction of each respective electromagnetic ray relative to a global coordinate system of the environment; determine a potential target of the plurality of potential targets that is closest to the first electromagnetic ray information; convert the first electromagnetic ray information to second electromagnetic ray information based on the potential target, the second electromagnetic ray information comprising the starting point and direction relative to a local coordinate system of the potential target; determine, based on the second electromagnetic ray information and a pre-calculated acceleration data structure indicative of a geometric profile of the potential target, whether a subset of the electromagnetic rays hit a facet of the potential target; responsive to determining that the subset of electromagnetic rays hit the facet of the potential target, calculate an electromagnetic response of the subset of electromagnetic rays that hit the facet on the potential target; determine whether the subset of the electromagnetic rays hit any facet of the potential target; and responsive to determining that the subset of the electromagnetic rays hit a facet of the potential target: calculate the electromagnetic response of the subset of the electromagnetic rays that hit the facet on the potential target; and output the electromagnetic response to an electromagnetic model for input to an execution of an electromagnetic sensor simulation of the environment; or responsive to determining that the subset of the electromagnetic rays do not hit any facet of the potential target, refrain from calculating or outputting the electromagnetic response of the subset of the electromagnetic rays that do not hit any facet of the potential target.

Example 53: The system of example 52, wherein the at least one processor is further configured to, responsive to determining that the subset of the electromagnetic rays do not hit any facet of the potential target: determine another potential target of the plurality of potential targets, the other potential target being a next-closest potential target to the respective starting point and direction of each electromagnetic ray in the set of electromagnetic rays; convert the first electromagnetic ray information to other second electromagnetic ray information based on the other potential target, the other second electromagnetic ray information comprising a starting point and direction relative to a local coordinate system of the other potential target; determine, based on the other second electromagnetic ray information, whether the subset of electromagnetic rays hit a facet of the other potential target; and calculate and output, to the model, the electromagnetic response of the other potential target based on whether the subset of electromagnetic rays hit a facet of the other potential target.

Example 54: The system of any one of the preceding examples, wherein the at least one processor is further configured to calculate the electromagnetic response by at least: determining, based on the subset of the electromagnetic rays hitting the facet of the potential target, at least one reflected electromagnetic ray being reflected from the potential target; determining third electromagnetic ray information comprising a starting point and direction of the reflected electromagnetic ray relative to the local coordinate system of the potential target; and converting the third electromagnetic ray information to fourth electromagnetic ray information including the starting point and direction of the reflected electromagnetic ray relative to the global coordinate system of the environment, the fourth electromagnetic ray information being used for a next potential target instead of the first electromagnetic ray information received.

Example 55: The system of any one of the preceding examples, wherein the at least one processor is further configured to: generate, based on incident fields with different polarizations, equivalent surface currents induced by the incident fields based on the first electromagnetic information; examine multiple possible scattering paths of the reflected electromagnetic ray; responsive to one or more of the multiple possible scattering paths being required scattering paths of the reflected electromagnetic ray, compute, based on the required scattering paths, scattered fields of the reflected electromagnetic ray for different polarizations; and record the scattered fields, a direction of departure, and a direction of arrival for each of the required scattering paths of the reflected electromagnetic ray.

Example 56: The system of any one of the preceding examples, wherein the pre-calculated acceleration data structure represents the potential target for a duration of an electromagnetic sensor simulation.

Example 57: The system of any one of the preceding examples, wherein the at least one processor is further configured to use the pre-calculated acceleration data structure by: using a same pre-calculated acceleration data structure indicative of a single geometric profile to represent multiple potential targets having a same computer-aided design (CAD) model.

Example 58: The system of any one of the preceding examples, wherein the at least one processor is further configured to: determine, based on material properties of each of the one or more potential targets, polarimetric reflection coefficients for each of the one or more potential targets; generate a polarimetric reflection coefficient lookup table that includes the polarimetric reflection coefficients for each of the one or more potential targets; and determine, based on the material of each of the one or more potential targets being penetrable above a threshold, transmission coefficients for each of the one or more potential targets.

Example 59: A computer-readable storage media comprising instructions that, when executed, cause at least one processor to: receive first electromagnetic ray information for a set of electromagnetic rays that are simulated in an environment that includes a plurality of potential targets, the first electromagnetic ray information including a starting point and direction of each respective electromagnetic ray relative to a global coordinate system of the environment; determine a potential target of the plurality of potential targets that is closest to the first electromagnetic ray information; convert the first electromagnetic ray information to second electromagnetic ray information based on the potential target, the second electromagnetic ray information comprising the starting point and direction relative to a local coordinate system of the potential target; determine, based on the second electromagnetic ray information and a pre-calculated acceleration data structure indicative of a geometric profile of the potential target, whether a subset of the electromagnetic rays hit a facet of the potential target; responsive to determining that the subset of electromagnetic rays hit the facet of the potential target, calculate an electromagnetic response of the subset of electromagnetic rays that hit the facet on the potential target; determine whether the subset of the electromagnetic rays hit any facet of the potential target; and responsive to determining that the subset of the electromagnetic rays hit a facet of the potential target: calculate the electromagnetic response of the subset of the electromagnetic rays that hit the facet on the potential target; and output the electromagnetic response to an electromagnetic model for input to an execution of an electromagnetic sensor simulation of the environment; or responsive to determining that the subset of the electromagnetic rays do not hit any facet of the potential target, refrain from calculating or outputting the electromagnetic response of the subset of the electromagnetic rays that do not hit any facet of the potential target.

Example 60: The computer-readable storage media of example 59, wherein the instructions, when executed, cause the at least one processor to calculate the electromagnetic response by at least: determining, based on the subset of the electromagnetic rays hitting the facet of the potential target, at least one reflected electromagnetic ray being reflected from the potential target; determining third electromagnetic ray information comprising a starting point and direction of the reflected electromagnetic ray relative to the local coordinate system of the potential target; and converting the third electromagnetic ray information to fourth electromagnetic ray information including the starting point and direction of the reflected electromagnetic ray relative to the global coordinate system of the environment, the fourth electromagnetic ray information being used for a next potential target instead of the first electromagnetic ray information received.

CONCLUSION

In conclusion, this document describes techniques and systems for accurate and efficient electromagnetic response for a sensor simulator. Target information and sensor parameters for an electromagnetic sensor are simulated in an environment that includes a ground plane. Electromagnetic rays that may be detected by the sensor or an image of the sensor are launched from the simulated sensor toward the target and an image of the target about the ground plane to determine a complex electromagnetic response of the target. A ray-tracing algorithm is applied to trace the forward wave propagation of electromagnetic rays in the environment that considers rays bouncing between the target and the image of the target. An electromagnetic response can be modeled based on the congregation of the electromagnetic response of all backward paths of all bounces of all rays. In this manner, an efficient and accurate electromagnetic response model may be approximated.

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims. Problems associated with simulating an environmental electromagnetic response can occur in other systems. Therefore, although described as a way to improve electromagnetic responses for a radar simulator, the techniques of the foregoing description can be applied to other systems that simulate other electromagnetic sensors.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. A method comprising:
   receiving target information for a target and sensor parameters for an electromagnetic sensor that are simulated in an environment with a ground plane;
   determining, based on the target information and the sensor parameters, electromagnetic rays interacting with the target, the electromagnetic rays having forward propagation paths to the target and backward propagation paths from the target; and
   modeling an electromagnetic response by approximating, based on determining the electromagnetic rays interacting with the target, electromagnetic energy reflected by the target alone or in combination with the ground plane,
   wherein determining the electromagnetic rays interacting with the target comprises:
   determining a target image for the target that mirrors the target about the ground plane;
   determining an electromagnetic sensor image that mirrors the electromagnetic sensor about the ground plane;
   launching initial electromagnetic rays from the electromagnetic sensor at the target and the target image, the initial electromagnetic rays having the same spatial ray density relative to the target and the target image;
   performing ray tracing to determine reflected electromagnetic rays from the target and the target image; and
   evaluating, based on equivalent surface currents, scattered fields of the reflected electromagnetic rays received by the electromagnetic sensor and the electromagnetic sensor image.

2. The method of claim 1, wherein evaluating scattered fields of the reflected electromagnetic rays received by the electromagnetic sensor and the electromagnetic sensor image further comprises:
   responsive to a respective ray of the initial electromagnetic rays being reflected by the target or crossing the ground plane, calculating dielectric Fresnel reflection coefficients for the target and the ground plane; and
   multiplying the scattered fields and respective incident fields by the dielectric Fresnel reflection coefficients.

3. The method of claim 2, wherein evaluating the scattered fields of the reflected electromagnetic rays comprises:
   computing the incident fields of the electromagnetic rays on the target using geometrical optics; and
   computing the equivalent surface currents on the target and the scattered fields of the reflected electromagnetic rays using physical optics.

4. The method of claim 1, wherein image theory is used to model the electromagnetic response for the simulated target.

5. The method of claim 1, wherein a shooting and bouncing rays method is used to approximate the electromagnetic energy propagated to the target and reflected by the target.

6. The method of claim 1, wherein approximating the electromagnetic energy reflected by the target includes multipath reflections from the ground plane.

7. The method of claim 1, wherein approximating the electromagnetic energy reflected by the target excludes reflections determined to be occluded by physical characteristics of the target.

8. The method of claim 1, wherein the target information comprises:
position of the target;
orientation of the target; and
speed of the target.

9. The method of claim 1, wherein the parameters of the electromagnetic sensor comprise:
position of the electromagnetic sensor;
orientation of the electromagnetic sensor;
field-of-view of the electromagnetic sensor; and
operating frequency of the electromagnetic sensor.

10. A system comprising:
at least one processor configured to:
receive target information for a target and sensor parameters for an electromagnetic sensor that are simulated in an environment with a ground plane;
determine, based on the target information and the sensor parameters, electromagnetic rays interacting with the target, the electromagnetic rays having forward propagation paths to the target and backward propagation paths from the target; and
model an electromagnetic response by approximating, based on determining the electromagnetic rays interacting with the target, electromagnetic energy reflected by the target alone or in combination with the ground plane,
wherein the at least one processor is configured to determine the electromagnetic rays associated with the target by at least:
determining a target image for the target that mirrors the target about the ground plane;
determining an electromagnetic sensor image that mirrors the electromagnetic sensor about the ground plane;
launching initial electromagnetic rays from the electromagnetic sensor at the target and the target image, the initial electromagnetic rays having the same spatial ray density relative to the target and the target image;
performing ray tracing to determine reflected electromagnetic rays from the target and the target image; and
evaluating, based on equivalent surface currents, scattered fields of the reflected electromagnetic rays received by the electromagnetic sensor and the electromagnetic sensor image.

11. The system of claim 10, wherein the at least one processor is configured to evaluate the scattered fields of the reflected electromagnetic rays received by the electromagnetic sensor and the electromagnetic sensor image by at least:
responsive to a respective ray of the initial electromagnetic rays being reflected by the target or crossing the ground plane, calculating dielectric Fresnel reflection coefficients for the target and the ground plane;
multiplying the scattered fields and respective incident fields by the dielectric Fresnel reflection coefficients;
computing, using ray tracing and geometrical optics, the incident fields of the electromagnetic rays on the target; and
computing, using physical optics, the equivalent surface currents on the target and the scattered fields of the reflected electromagnetic rays.

12. The system of claim 10, wherein the at least one processor is configured to approximate the electromagnetic energy reflected by the target by including multipath reflections from the ground plane.

13. The system of claim 10, wherein the at least one processor is configured to approximate the electromagnetic energy reflected by the target by excluding reflections determined to be occluded by physical characteristics of the target.

14. A non-transitory computer-readable storage media comprising instructions that, when executed, cause at least one processor to:
receive target information for a target and sensor parameters for an electromagnetic sensor that are simulated in an environment with a ground plane;
determine, based on the target information and the sensor parameters, electromagnetic rays interacting with the target, the electromagnetic rays having forward propagation paths to the target and backward propagation paths from the target; and
model an electromagnetic response by approximating, based on determining the electromagnetic rays interacting with the target, electromagnetic energy reflected by the target alone or in combination with the ground plane,
wherein the instructions, when executed, further cause the at least one processor to determine the electromagnetic rays interacting with the target by at least:
determining a target image for the target that mirrors the target about the ground plane;
determining an electromagnetic sensor image that mirrors the electromagnetic sensor about the ground plane;
launching initial electromagnetic rays from the electromagnetic sensor at the target and the target image, the initial electromagnetic rays having the same spatial ray density relative to the target and the target image;
performing ray tracing to determine reflected electromagnetic rays from the target and the target image; and
evaluating, based on equivalent surface currents, scattered fields of the reflected electromagnetic rays received by the electromagnetic sensor and the electromagnetic sensor image.

15. The non-transitory computer-readable storage media of claim 14, wherein the instructions, when executed, further cause the at least one processor to evaluate the scattered fields of the reflected electromagnetic rays received by the electromagnetic sensor and the electromagnetic sensor image by at least:
responsive to a respective ray of the initial electromagnetic rays being reflected by the target or crossing the ground plane, calculating dielectric Fresnel reflection coefficients for the target and the ground plane;
multiplying the scattered fields and respective incident fields by the dielectric Fresnel reflection coefficients;
computing, using ray tracing and geometrical optics, the incident fields of the electromagnetic rays on the target; and
computing, using physical optics, the equivalent surface currents on the target and the scattered fields of the reflected electromagnetic rays.

16. The non-transitory computer-readable storage media of claim 14, wherein the instructions, when executed, cause the at least one processor to approximate the electromagnetic energy reflected by the target by including multipath reflections from the ground plane.

17. The non-transitory computer-readable storage media of claim 14, wherein the instructions, when executed, cause the at least one processor to approximate the electromagnetic energy reflected by the target by excluding reflections determined to be occluded by physical characteristics of the target.

* * * * *